United States Patent
Li et al.

(10) Patent No.: US 7,622,424 B2
(45) Date of Patent: Nov. 24, 2009

(54) THICK SUPERCONDUCTOR FILMS WITH IMPROVED PERFORMANCE

(75) Inventors: Xiaoping Li, Westborough, MA (US); Thomas Kodenkandath, N. Grafton, MA (US); Edward J. Siegal, Malden, MA (US); Wei Zhang, Shrewsbury, MA (US); Martin W. Rupich, Framingham, MA (US); Yibing Huang, Northborough, MA (US)

(73) Assignee: American Superconductor Corporation, Westborough, MA (US)

( * ) Notice: Subject to any disclaimer, the term of this patent is extended or adjusted under 35 U.S.C. 154(b) by 517 days.

(21) Appl. No.: 11/241,636

(22) Filed: Sep. 30, 2005

(65) Prior Publication Data

US 2006/0094603 A1      May 4, 2006

Related U.S. Application Data

(60) Provisional application No. 60/615,289, filed on Oct. 1, 2004, provisional application No. 60/703,836, filed on Jul. 29, 2005.

(51) Int. Cl.
*H01B 12/00*      (2006.01)

(52) U.S. Cl. .................. 505/235; 505/123; 505/238

(58) Field of Classification Search .......... 505/235, 505/236, 237, 780, 123, 238, 778; 428/701
See application file for complete search history.

(56) References Cited

U.S. PATENT DOCUMENTS

| | | | |
|---|---|---|---|
| 5,231,074 A | 7/1993 | Cima et al. | |
| 6,022,832 A | 2/2000 | Fritzemeier et al. | |
| 6,027,564 A | 2/2000 | Fritzemeier et al. | |
| 6,190,752 B1 | 2/2001 | Do et al. | |
| 6,332,967 B1 | 12/2001 | Bhattacharya et al. | |

(Continued)

FOREIGN PATENT DOCUMENTS

| | | |
|---|---|---|
| JP | 2003-206134 | 7/2003 |
| WO | WO-98/58415 | 12/1998 |
| WO | WO-99/16941 | 4/1999 |
| WO | WO-99/17307 | 4/1999 |
| WO | WO-00/58044 | 10/2000 |

(Continued)

OTHER PUBLICATIONS

Dawley, J.T. et al., High $J_c$ $YBa_2Cu_3O_{7-\delta}$ films via rapid, low $pO_2$ pyrolysis, J. Mater. Res., vol. 16 No. 1, p. 13-16 (Jan. 2001).

(Continued)

*Primary Examiner*—Mark Kopec
(74) *Attorney, Agent, or Firm*—Wilmer Cutler Pickering Hale & Dorr LLP.

(57) ABSTRACT

A method for producing a thick film includes disposing a precursor solution onto a substrate to form a precursor film. The precursor solution contains precursor components to a rare-earth/alkaline-earth-metal/transition-metal oxide including a salt of a rare earth element, a salt of an alkaline earth metal, and a salt of a transition metal in one or more solvents, wherein at least one of the salts is a fluoride-containing salt, and wherein the ratio of the transition metal to the alkaline earth metal is greater than 1.5. The precursor solution is treated to form a rare earth-alkaline earth-metal transition metal oxide superconductor film having a thickness greater than 0.8 µm. precursor solution.

16 Claims, 8 Drawing Sheets

U.S. PATENT DOCUMENTS

| | | | |
|---|---|---|---|
| 6,436,317 | B1 | 8/2002 | Malozemoff et al. |
| 6,624,122 | B1 | 9/2003 | Holesinger et al. |
| 6,690,957 | B2 | 2/2004 | Akasegawa et al. |
| 6,716,545 | B1 | 4/2004 | Holesinger et al. |
| 6,797,313 | B2 | 9/2004 | Fritzemeier et al. |
| 6,974,501 | B1 | 12/2005 | Zhang et al. |
| 7,307,046 | B2* | 12/2007 | Tetsuji et al. ............. 505/445 |
| 7,361,377 | B2* | 4/2008 | Wiesmann et al. ........... 427/62 |
| 2002/0139960 | A1* | 10/2002 | Manabe et al. ............. 252/500 |
| 2003/0127051 | A1 | 7/2003 | Fritzemeier et al. |
| 2004/0192559 | A1 | 9/2004 | Araki et al. |
| 2005/0159298 | A1* | 7/2005 | Rupich et al. ............. 502/100 |
| 2006/0073979 | A1 | 4/2006 | Thieme et al. |
| 2006/0240989 | A1* | 10/2006 | Bock et al. ............... 505/100 |
| 2007/0197397 | A1* | 8/2007 | Backer et al. ............. 505/430 |
| 2008/0153709 | A1* | 6/2008 | Rupich et al. ............. 505/230 |

FOREIGN PATENT DOCUMENTS

| | | |
|---|---|---|
| WO | WO-00/58530 | 10/2000 |
| WO | WO-01/08169 | 2/2001 |
| WO | WO-01/08170 | 2/2001 |
| WO | WO-01/08232 | 2/2001 |
| WO | WO-01/08233 | 2/2001 |
| WO | WO-01/08235 | 2/2001 |
| WO | WO-01/08236 | 2/2001 |
| WO | WO-01/11428 | 2/2001 |
| WO | WO-01/15245 | 3/2001 |
| WO | WO-01/26164 | 4/2001 |
| WO | WO-01/26165 | 4/2001 |
| WO | WO-02/35615 | 5/2002 |
| WO | WO 2007-069524 | 6/2007 |

OTHER PUBLICATIONS

Dawley, J.T. et al., Improving sol-gel $YBa_2Cu_3O_{7-\delta}$ film morphology using high-boiling-point solvents, J. Mater. Res., vol. 17 No. 8, p. 1900-1903 (Aug. 2002).

Lee, D.J. et al., Japanese J. Appl. Phys., vol. 38, L178 (1999).

Paranthaman, M. et al., Superconductor Sci. Tech., vol. 12, 319 (1999).

Rupich, M.W. et al., I.E.E.E. Trans. On Appl. Supercon. vol. 9, 1527.

Shoup, S.S. et al., J. Am. Cer. Soc., vol. 81, 3019.

Shoup et al, "Sol-Gel Synthesis of LaAl03; Epitaxial Growth of LaAl03 Thin Films on SrTiO3(100)", J. Mat. Research, 1997, vol. 12, pp. 1017-1021.

PCT, International Search Report, mailed Aug. 29, 2007.

U.S. Appl. No. 11/494,993, filed Jul. 28, 2006, Kodenkandath et al.

U.S. Appl. No. 60/166,297, filed Nov. 18, 1999, Fritzemeier.

U.S. Appl. No. 60/308,957, filed Jul. 31, 2001, Fritzemeier.

U.S. Appl. No. 60/309,116, filed Jul. 31, 2001, Fritzemeier et al.

Beach, D. et al., "Sol-Gel Synthesis of Rare Earth Aluminate Films as Buffer Layers for High Tc Superconducting Films", *Mat. Res. Soc. Symp. Proc.*, vol. 495, pp. 263-270, 1988.

Lee, D.J. et al., "Alternative Buffer Architectures for High Critical Current Density YBCO Superconducting Deposits on Rolling Assisted Biaxially-Textured Substrates", *Japanese J. Appl. Phys.*, vol. 38, L178-L180 Feb. 15, 1999.

Paranthaman, M. et al., "Growth of biaxially textured RE2O3 buffer layers on rolled-Ni substrates using reactive evaporation for HTS-coated conductors", *Superconductor Sci.Tech.*, vol. 12, pp. 319-325, 1999.

Rupich, M.W. et al., "Growth and Characterization of Oxide Buffer Layers for YBCO Coated Conductors", *I.E.E.E. Trans. on Appl. Supercon.*, vol. 9, No. 2, pp. 1527-1530, Jun. 1999.

Shoup et al, Epitaxial Thin Film Growth of Lanthanum and Neodymium Aluminate Films on Roll-Textured Nickel Using a Sol-Gel Method, *J. Am. Cer. Soc.*, vol. 81, pp. 3019-3021, 1988.

* cited by examiner

THICK SUPERCONDUCTOR FILMS WITH IMPROVED PERFORMANCE

CROSS REFERENCE TO RELATED APPLICATIONS

This application claims priority under 35 U.S.C. §119(e) to U.S. Provisional Application Ser. No. 60/615,289, filed on Oct. 1, 2004 and to U.S. Provisional Application Ser. No. 60/703,836, filed on Jul. 29, 2005, both entitled "Thick Superconductor Films With Improved Performance," and both incorporated herein by reference.

This application is related to the following applications, the entire contents of which are incorporated herein by reference:

U.S. Patent Application Ser. No. 60/703,815, filed on Jul. 29, 2005, and entitled "High Temperature Superconductive Wires and Coils;"

U.S. Patent Application Ser. No. 11/193,262, filed on Jul. 29, 2005, and entitled "Architecture for High Temperature Superconductor Wire."

FIELD OF THE INVENTION

The present invention relates generally to enhancing critical current density carrying capacity of superconducting materials. The present invention also relates to superconducting structures and to a method of improving superconducting properties of rare earth-alkaline earth-transition metal oxide films.

BACKGROUND OF THE INVENTION

Since the discovery of high-temperature superconducting (HTS) materials (superconducting above the liquid nitrogen temperature of 77 K) there have been efforts to research and develop various engineering applications using such HTS materials. In thin film superconductor devices and wires, the most progress has been made with fabrication of devices utilizing an oxide superconductor including yttrium, barium, copper and oxygen in the well-known basic composition of $YBa_2Cu_3O_{7-x}$ (hereinafter referred to as Y123 or YBCO). Much progress has also been made with rare earth elements "RE" substituted for Y. Biaxially textured superconducting metal oxides, such as Y123, have achieved high critical current densities in coated conductor architecture. These wires are often referred to as second generation HTS wires. Thus, Y123 is the preferred material for many applications, including cables, motors, generators, synchronous condensers, transformers, current limiters, and magnet systems for military, high energy physics, materials processing, transportation and medical uses.

Certain challenges in this field include the need for cost effective methods for producing chemically compatible biaxially textured buffer layers, as well as the need to deposit sufficient thickness of the high critical current density (Jc) superconducting layer. Regarding the first objective, it appears that deformation textured substrates with epitaxial buffer layers can be made cost effective. Regarding the need to deposit thick layers of superconductor precursor compositions, a number of techniques have been evaluated. Chemical vapor deposition (CVD) is not considered a competitive method at this time, due to the very high cost of precursor materials. Most physical vapor deposition (PVD) methods, (for example, pulsed laser ablation, reactive sputtering and electron beam evaporation) are limited by deposition rate, compositional control, and high capital costs. A possible economical PVD method would be thermal or electron beam evaporation of the rare earth elements, copper and barium fluoride, known as the "barium fluoride" process. This process appears to be more rapid than direct PVD methods, but capital costs and control system costs are still likely to be too high. Additionally, the deposited precursor composition must subsequently be reacted in a separate furnace system to form the HTS film.

Solution deposition methods have been evaluated, and these appear to offer much lower costs, since vacuum systems are eliminated. Thus, capital costs are not as high, and deposition rates not as low, as other methods using vacuum systems. Trifluoroacetate (TFA) solution processes offer low costs for precursor compositions, high deposition rate, and non-vacuum processing advantages. Such processes are described, for example, in U.S. Pat. No. 5,231,074 to Cima et al., and PCT Publication No. WO 98/58415, published Dec. 23, 1998 and require dissolution of the constituents of the precursor composition to form a solution phase. Both U.S. Pat. No. 5,231,074 and PCT Publication No. WO 98/58415 are hereby incorporated by reference in their entirety.

SUMMARY OF THE INVENTION

In one aspect, this invention provides a composition serving as a precursor to superconducting films, which can be coated onto large area substrates in a single application using high-deposition rate, to produce a desired film thickness. The precursor composition is preferably convertible to the superconducting phase by way of simple thermal processes. The invention provides a low cost method for fabricating thick film precursor compositions of rare-earth superconductors on long lengths of substrate.

In one aspect of the invention a process for preparing a superconductor film includes depositing a first precursor solution onto a substrate to form a precursor film, the first precursor solution comprising precursor components to a rare earth-alkaline earth metal-transition metal oxide including a salt of a rare earth element, a salt of an alkaline earth metal, and a salt of a transition metal in one or more solvents, wherein at least one of the salts is a fluoride-containing salt, and wherein the ratio of the transition metal to the alkaline earth metal is greater than 1.5; and treating the precursor film to form a rare earth-alkaline earth metal-transition metal oxide superconductor, wherein the overall ratio of the transition metal to the alkaline earth metal in the precursor film is greater than 1.5, and wherein the overall thickness of the superconductor film is greater than 0.8 µm.

In one or more embodiments, the process includes treating the precursor film to form an intermediate metal oxyfluoride film including the rare earth, the alkaline earth metal, and the transition metal of the first precursor solution, and heating the intermediate metal oxyfluoride film to form a rare earth-alkaline earth metal-transition metal oxide superconductor. The metal oxyfluoride film includes yttrium, barium and copper and the film has a ratio of barium:copper of about 2:3 proximate to the substrate/metal oxyfluoride interface. The intermediate metal oxyfluoride film is obtained by heating the film at a temperature in the range of about 190° C. to about 650° C. to decompose the precursor components of the first precursor solution, or heating the film at a temperature in the range of about 190° C. to about 400° C. to decompose the precursor components of the first precursor solution. In another embodiment, the intermediate metal oxyfluoride film is obtained by heating at a temperature in the range of about 700° C. to about 825° C. in an environment having a total pressure of about 0.1 Torr to about 760 Torr and containing about 0.09 Torr to about 50 Torr oxygen and about 0.01 Torr to about 150 Torr water vapor.

In one or more embodiments, the ratio of transition metal to alkaline earth metal in the precursor solution or the final oxide superconductor is greater than 1.6, or in the range of about greater than 1.5 to about 1.8. The transition metal can be copper and the alkaline earth metal includes barium.

In one or more embodiments, the first precursor solution includes at least about 5 mol % excess copper, or at least about 20 mol % excess copper.

In one or more embodiments, the first precursor solution is at least 5 mol % deficient in barium, or at least 20 mol % deficient in barium.

In one or more embodiments, the first precursor solution is deposited at a thickness greater than 1.0 μm, and/or the superconductor film has an overall thickness of greater than 1.0 μm.

In one or more embodiments, the first precursor solution is deposited in two or more deposition steps. The step of depositing a precursor film further includes depositing a second precursor solution including precursor components to a rare earth-alkaline earth metal-transition metal oxide comprising a salt of a rare earth element, a salt of an alkaline earth metal, and a salt of said transition metal in one or more solvents, wherein at least one of the salts is a fluoride-containing salt, wherein the ratio of the transition metal to the alkaline earth metal is about 1.5, and wherein the composition of the second precursor is different from the composition of the first precursor.

In one or more embodiments, the second precursor solution includes one or more of an additive component or a dopant component selected for formation of a flux pinning site in the superconducting film. The additive component includes soluble components that form secondary phase nanoparticles under conditions used to treat the precursor film, wherein the soluble components are selected from the group consisting of compounds of rare earths, alkaline earths, transition metals, cerium, zirconium, silver, aluminum and magnesium. The dopant component includes a metal that partially substitutes for a rare earth, alkaline earth or transition metal of the oxide superconductor.

In one or more embodiments, the second precursor solution can be deposited prior to the deposition of the first precursor solution, or the second precursor solution can be deposited subsequent to the first precursor solution.

In one or more embodiments, the second precursor solution is deposited to form an oxide superconductor film having an overall thickness of less than 0.8 μm.

In one or more embodiments, the substrate is biaxially oriented, and the superconductor film is biaxially oriented and has a c-axis orientation that is substantially constant across its width, the c-axis orientation of the superconductor film being substantially perpendicular to the surface of the substrate.

In one or more embodiments, the first precursor solution includes one or more of an additive component or a dopant component selected for formation of a flux pinning site in the superconducting film. The additive component includes soluble components that form secondary phase nanoparticles under conditions used to treat the precursor film, wherein the soluble components are selected from the group consisting of compounds of rare earths, alkaline earths, transition metals, cerium, zirconium, silver, aluminum and magnesium. The dopant component includes a metal that partially substitutes for a rare earth, alkaline earth or transition metal of the oxide superconductor.

In another aspect of the invention a process for preparing a superconductor film includes disposing, in any order, onto a substrate to form a precursor film, a first precursor solution including a salt of a transition metal in one or more solvents, and a second precursor solution including precursor components to a rare earth-alkaline earth metal-transition metal oxide comprising a salt of a rare earth element, a salt of an alkaline earth metal, and a salt of said transition metal in one or more solvents, wherein at least one of the salts is a fluoride-containing salt, and wherein the ratio of transition metal to alkaline earth metal is at least 1.5; and treating the precursor film to form a rare earth-alkaline earth metal-transition metal oxide superconductor, wherein the overall ratio of the transition metal to the alkaline earth metal in the precursor film is greater than 1.5, and wherein the overall thickness of the superconductor film is greater than 0.8 μm or greater than 1.0 μm. The step of treating the precursor film includes treating the precursor film to form an intermediate film including the rare earth, the alkaline earth metal, and the transition metal of the first and second precursor solution; and heating the intermediate film to form a rare earth-alkaline earth metal-transition metal oxide superconductor.

In one or more embodiments, the precursor film is heated after deposition of each precursor solution to form an intermediate film including the metallic components of the precursor solution.

In one or more embodiments, the overall ratio of transition metal to alkaline earth metal is greater than 1.6, or in the range of about greater than 1.5 to about 1.8. The transition metal includes copper and the alkaline earth metal includes barium.

In one or more embodiments, the first precursor solution consists essentially of copper.

In one or more embodiments, the first precursor solution is deposited before the second precursor.

In one or more embodiments, the second precursor solution has a copper to barium ratio of about 1.5, the second precursor solution has a copper to barium ratio of greater than 1.5.

In one or more embodiments, the second precursor further includes at least one of an additive component and a dopant component selected for forming pinning centers.

In one or more embodiments, the method includes disposing a copper solution onto the substrate to form a copper precursor layer; and disposing a second precursor solution including salts of a yttrium, barium and copper onto the copper precursor layer, wherein the ratio of copper to barium is at least 1.5.

In one or more embodiments, the substrate is biaxially oriented, and the superconductor film is biaxially oriented and has a c-axis orientation that is substantially constant across its width, the c-axis orientation of the superconductor film being substantially perpendicular to the surface of the substrate.

In another aspect of the invention, an article includes a biaxially textured substrate having thereon a superconducting layer, wherein said superconducting layer includes a rare earth barium copper oxide superconductor; wherein the superconducting layer has a thickness of greater than 0.8 μm, a Cu to Ba ratio of greater than 1.5; and the superconducting layer includes fluoride. The copper to barium ratio can be greater than 1.6, and/or the superconductor film has a thickness greater than 1.0 μm In one or more embodiments, the substrate includes a buffer layer including a material selected from the group consisting of cerium oxide, lanthanum aluminum oxide, lanthanum manganese oxide, strontium titanium oxide, magnesium oxide, neodymium gadolinium oxide, and a cerium oxide/yttria-stabilized zirconia.

In one or more embodiments, the superconducting layer has a critical current density of at least 200 Amps/cmW at a temperature of 77 K.

In another aspect of the invention a metal oxyfluoride film includes an oxyfluoride film on a substrate, the film including one or more rare earth elements, one or more alkaline earth metals and one or more transition metals, wherein the thickness of the film is greater than 0.8 μm, and wherein the ratio of the transition metal to the alkaline earth metal is greater than 1.5 and the film has a ratio of barium:copper: is about 2:3 proximate to the substrate/metal oxyfluoride interface. The copper to barium ratio can be greater than 1.6, and/or the thickness of the film is greater than 1.0 μm.

In one or more embodiments, the substrate includes a buffer layer including a material selected from the group consisting of cerium oxide, lanthanum aluminum oxide, lanthanum manganese oxide, strontium titanium oxide, magnesium oxide, neodymium gadolinium oxide, and a cerium oxide/yttria-stabilized zirconia.

In another aspect of the invention a superconductor film is prepared by a process including the steps of adjusting the ratio of a transition metal to an alkaline earth metal in a precursor solution, wherein the ratio of the transition metal to the alkaline earth metal is greater than 1.5; depositing the precursor solution onto a substrate to form a precursor film; and decomposing the precursor film to achieve a ratio of the transition metal to the alkaline earth metal of about 1.5 proximate to the precursor film and substrate interface, wherein the overall ratio of the transition metal to the alkaline earth metal in the superconductor film is greater than 1.5, and wherein the overall thickness of the superconductor film is greater than 0.8 μm.

In one or more embodiments, the step of adjusting the ratio of the transition metal to the alkaline earth metal includes increasing the transition metal content in the precursor solution.

In one or more embodiments, the transition metal content in the precursor solution is increased by at least 5%, or at least 20%.

In one or more embodiments, the step of adjusting the ratio of the transition metal to the alkaline earth metal includes decreasing the alkaline earth metal content in the precursor solution.

In one or more embodiments, the alkaline earth metal content in the precursor solution is decreased by at least 5%, or at least 20%.

BRIEF DESCRIPTION OF THE DRAWINGS

The present invention is described with reference to the following drawings, which are presented for the purpose of illustration only and are not intended to be limiting of the invention.

DETAILED DESCRIPTION OF THE INVENTION

Precursor compositions and methods are described for depositing precursor compositions of superconducting material on substrates, either directly onto the substrate, or onto a buffer- and/or intermediate-coated substrate, thereby forming biaxially textured superconducting oxide films from the precursor compositions. The precursor compositions include components that are a salt of a rare earth element, a salt of an alkaline earth metal, and a salt of a transition metal in one or more solvents.

Figure 1:
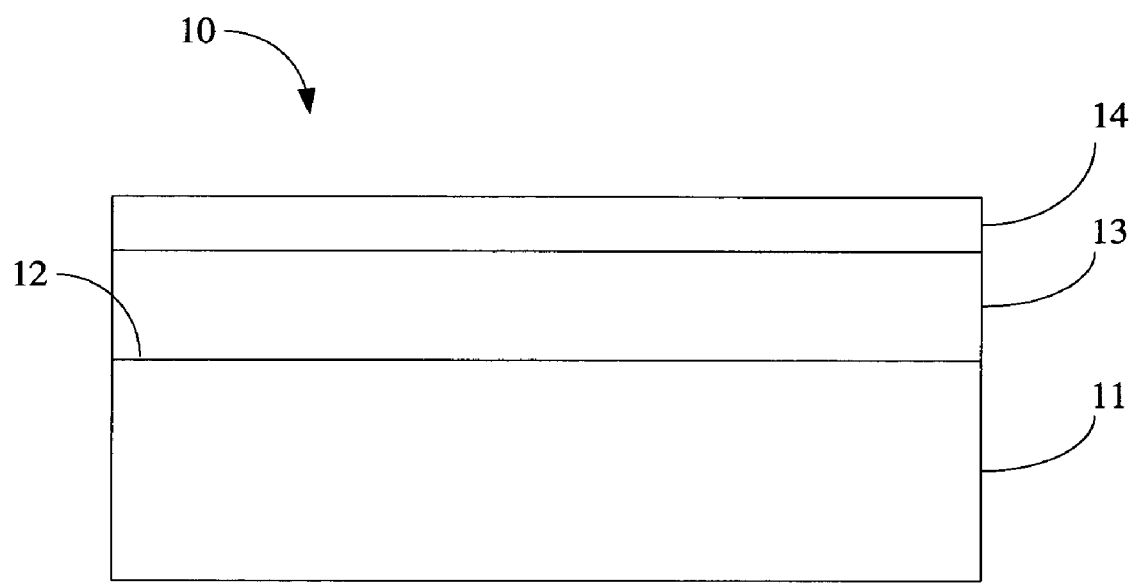
FIG. 1 is a schematic representation of a superconducting article in accordance with the present invention.

FIG. 1 shows one embodiment for HTS coated conductors. Referring to FIG. 1, high temperature superconductor (HTS) articles such as 10, particularly in the form of wires or tapes, generally include at least one biaxially-textured substrate 11 with surface 12, at least one epitaxial buffer layer 13, and a top layer of in-plane aligned, c-axis oriented superconducting layer of a rare earth-alkaline earth-transition metal oxide superconductor (RE-123) 14. Although the methods and compositions described herein apply generally to all RE-123 superconductors, the methods and articles are illustrated with reference to YBCO. The metal substrate, such as Ni, Ag, or Ni alloys, provides flexibility for the article and can be fabricated over long lengths and large areas. Metal oxide layers, such as $LaAlO_3$, $Y_2O_3$, $CeO_2$, or yttria-stabilized zirconia (YSZ), make up the next layer and serve as chemical barriers between the metal substrate and the active layer. The buffer layer(s) can be more resistant to oxidation than the substrate and can reduce the diffusion of chemical species between the substrate and the superconductor layer. Moreover, the buffer layer(s) can have a coefficient of thermal expansion that is well matched with the superconductor material.

Figure 2:
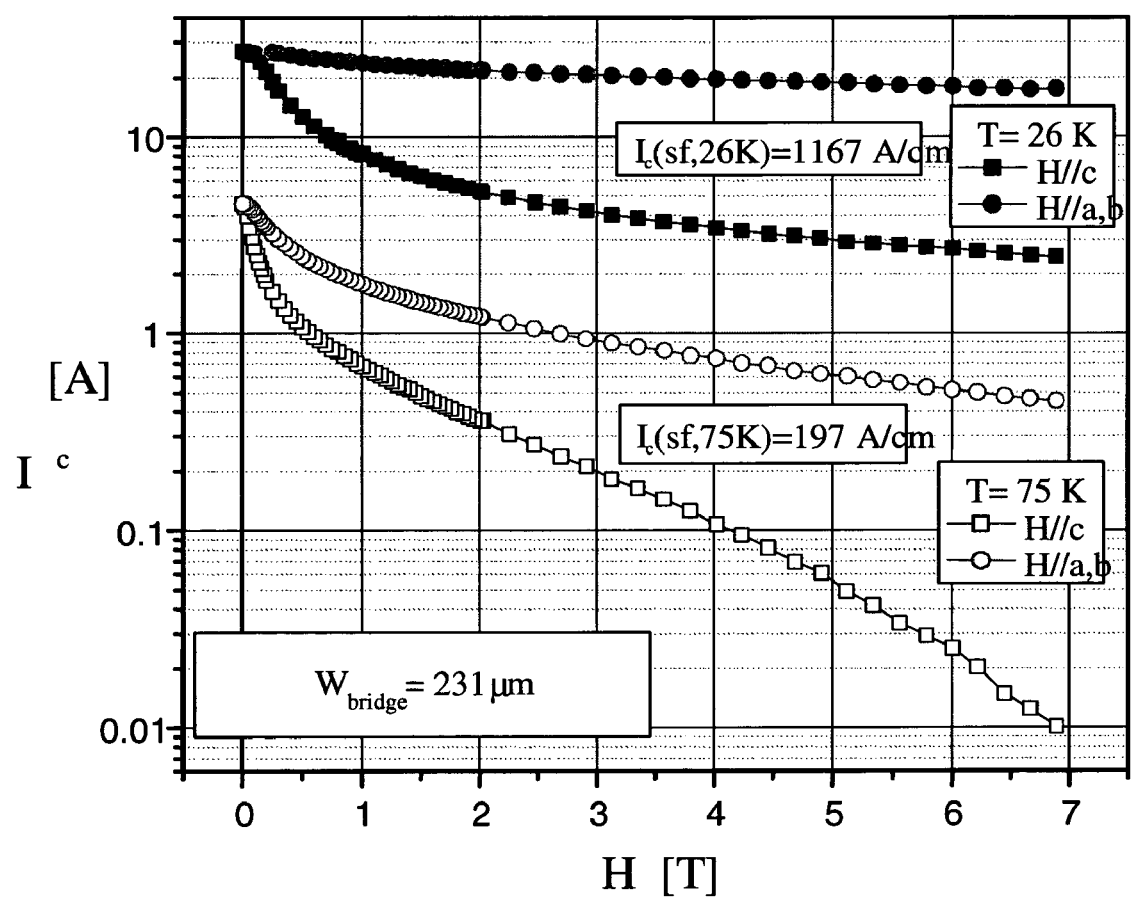
FIG. 2 illustrates the Ic dependence of Y123 (YBCO) film on an oxide-buffered metal substrate as a function of magnetic field and temperature.
Figure 3:
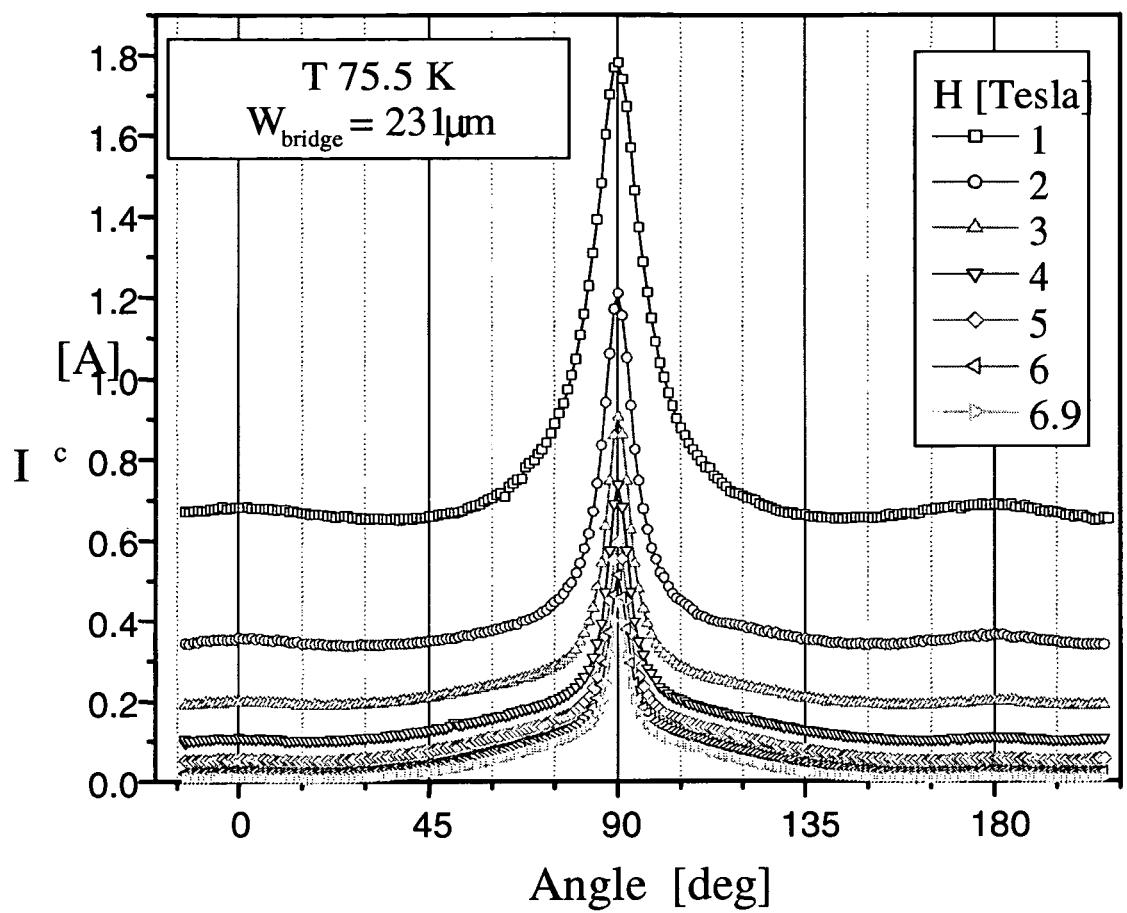
FIG. 3 illustrates Ic as a function of field orientation of a YBCO film on an oxide-buffered metal substrate.

FIG. 2 shows the typical field dependence of a metal-organic deposited (MOD) YBCO film on an oxide-buffered metal substrate with magnetic field oriented parallel and perpendicular to the planar face of the film. At 75K, with the magnetic field oriented perpendicular to the planar face of the film, there is a significant decrease in critical current (Ic) from the value in parallel orientation, limiting the usefulness of the Y123 wires in many coil applications. Although the performance improves as the temperature is lowered, many anticipated applications are planned for temperatures in the 55 to 65K region in magnetic fields of 1-3 Tesla oriented perpendicular to the planar face of the film, which are conditions at which performance drops significantly. In addition to the parallel and perpendicular performance of the YBCO wires in magnetic field, it is important to examine the field performance at intermediate angles as shown in FIG. 3. As seen in FIG. 3, YBCO films typically show a small peak in the c-axis (0 and 180° or perpendicular to the planar face of the YBCO film), which can be enhanced through the presence of extended planar or linear defects (e.g., twin boundaries, grain boundaries, a-axis grains). However, for practical applications the YBCO wire performance is determined by the minimum performance with H in any orientation, and not solely by that at the perpendicular orientation.

A metal organic (solution based) deposition (MOD) process is used to obtain highly oriented oxide superconducting films. An MOD process represents an attractive system because the precursor solution is versatile and can be varied over a wide range of compositions and concentrations. In an MOD process to make RE-123 films from TFA precursors, precursor solutions are decomposed to form a film containing an intermediate of RE-123 (e.g. a metal oxyhalide intermediate). An oxyfluoride film is considered to be any film that is a precursor to a RE-123 oxide superconductor film that is comprised of (1) a mixture of $BaF_2$, a rare earth oxide or fluoride and/or transition metal, transition metal oxide or transition metal fluoride, (2) a mixture of a compound comprised of a RE—Ba—O—F phase, a rare earth oxide or fluoride and/or transition metal oxide or fluoride, or (3) as a mixture of a compound comprised of a Ba—O—F phase, rare earth oxides or fluorides and/or transition metal oxide or fluoride. The intermediate film can then be further processed to form a RE-123 oxide superconductor film.

Rutherford Back Scattering (RBS) measurements and nuclear activation measurements on YBCO films made by using TFA solution deposition methods indicate that there is a cation distribution through the thickness of the decomposed metal oxyhalide intermediate film. Simulations to fit RBS data have shown that the copper concentration is higher at the surface and lower at the buffer/YBCO interface, the barium concentration is lower at the surface and higher at the interface, and the Y concentration is relatively constant through the thickness. Examination by nuclear activation analysis has shown that fluorine has a distribution along the thickness direction; it increases at the interface and decreases towards the surface. This distribution of cation concentrations in the intermediate decomposed film is more problematic for thick films (e.g., overall film thickness of greater than 0.8 μm) than for thin films because the cations need to diffuse a longer distance to redistribute during the reaction. In contrast, there is a flat distribution of all elements in the final oxide superconductor film, indicating the redistribution of the elements during the final reaction of the intermediate oxyfluoride film to oxide superconductor. The oxide superconductor film also indicates a small, but detectable fluoride residue. Although analysis of the HTS films shows an enhancement of Cu concentration in the top of the film, bulk analysis of the films show no substantial loss of any cation from the film, (i.e., the metal concentration in the decomposed film is essentially unchanged from the metal concentration of the precursor solution).

In an MOD process to make YBCO films from TFA precursors, YBCO nucleation at the buffer layer/metal oxyfluoride layer interface is one factor in texture development. To improve the outcome, the constituent elements should be near stoichiometric ratio at the buffer/YBCO interface when the nucleation occurs, e.g., near Ba:Cu=2:3. In conventional processing of YBCO films from TFA precursors using a stoichiometric precursor solution (Y:Ba:Cu=1:2:3), uneven cation distribution throughout the oxyfluoride film results in off-stoichiometry at the buffer/YBCO interface. For example, the interface region has a copper to barium ratio of less than 1.5 and the surface of the film has a copper to barium ratio of greater than 1.5 in some thicker (e.g., greater than 0.8 μm) films. As the film thickness increases the variation between the Cu and Ba concentrations at the top and bottom of the film is even more pronounced. Copper deficiency at the buffer/YBCO interface, e.g., a low ratio of copper to barium, can result in poor nucleation of YBCO or reduced growth kinetics, thereby leading to degraded performance of the YBCO films. Additionally, maintaining a Cu to Ba ratio of greater than 1.5 through out the film thickness can improve the growth of the YBCO throughout the film thickness. By "near stoichiometric" as that term is used herein it is meant a ratio of alkaline earth to transition metal of about 2:3 in a RE-123 film.

According to one or more embodiments of the present invention, the transition metal concentrations in the precursor solutions are adjusted to achieve an overall transition metal to alkaline earth metal ratio of greater than 1.5. The overall transition metal to alkaline earth metal ratio can be at least 1.6, or at least 1.8, or at least 2.0 or can be in the range of 1.65-1.95. The precursor solution can be deposited in one or more layers of the same or different composition to achieve an overall transition metal to alkaline earth metal ratio of greater than 1.5 and an overall thickness of greater than about 0.8 μm or about 1.0 μm. By "overall" as that term is used herein it is meant the total one or more layers that are deposited in the formation a of superconductor film.

A YBCO film can be prepared by adjusting the Cu and Ba content in the precursor solution to achieve an overall Cu to Ba ratio of greater than 1.5. The precursor film is then decomposed to achieve a metal oxyfluoride film having near stoichiometric Ba:Cu=2:3 at the buffer/YBCO interface region and an overall Cu to Ba ratio greater than 1.5.

A YBCO film can be prepared by increasing the Cu content in a precursor solution, and decomposing the precursor film to achieve a near stoichiometric Ba:Cu=2:3 at the buffer/YBCO interface and an overall Cu to Ba ratio greater than 1.5. The Cu content in the precursor solution can be increased by at least about 5 mol %, or by at least about 10 mol %, or at least about 20 mol %, or about 5-30 mol % relative to the metal content needed to prepare a precursor solution containing stoichiometric proportions of the constituent alkaline earth and transition metals.

A YBCO film can be prepared by decreasing the Ba content in a precursor solution, and decomposing the precursor film to achieve a near stoichiometric Ba:Cu=2:3 at the buffer/YBCO interface region and an overall Cu to Ba ratio greater than 1.5. The Ba content in the precursor solution can be decreased by at least about 5 mol %, or by at least about 10 mol %, or at least about 20 mol %, or about 5-30 mol % relative to the metal content needed to prepare a precursor solution containing stoichiometric proportions of the constituent metals.

A YBCO film can be prepared by increasing the Cu content while decreasing the Ba content in a precursor solution, and decomposing the precursor film to achieve a near stoichiometric Ba:Cu=2:3 at the buffer/YBCO interface region and an overall Cu to Ba ratio greater than 1.5. The Cu content in the precursor solution can be increased by at least about 5 mol %, or by at least about 10 mol %, or at least about 20 mol %, or about 5-30 mol % while the Ba content in the precursor solution can be decreased by at least about 5 mol %, or by at least about 10 mol %, or at least about 20 mol %, or about 10-30 mol % relative to the metal content needed to prepare a precursor solution containing stoichiometric proportions of the constituent metals.

The composition of the precursor solution may be further adjusted to provide oxide superconducting layers having improved performance, while maintaining an overall transition metal to alkaline earth ratio of greater than 1.5 in the superconducting film. By way of example, the presence of nanoscale defects or nanoparticles in the grains of the oxide superconductor serve as flux pinning centers, which improve electrical performance in a magnetic field. In one aspect of the invention, a precursor solution including precursor components for the formation of a rare-earth/alkaline-earth-metal/transition-metal oxide (hereinafter "RE-123") having an overall transition metal to alkaline earth metal ratio of greater than 1.5 and additive components and/or dopant components for the formation of flux pinning sites is used in a solution-based method to obtain a superconducting film having pinning centers.

A dopant component provides a dopant metal that partially substitutes for a metal of the precursor component of the precursor solution. Generally, a dopant component can be any metal compound that is soluble in the solvent(s) contained in the precursor solution and that, when processed to form an oxide superconductor, provided a dopant metal that substitutes for an element of the oxide superconductor.

An additive component includes soluble compounds of rare earths, alkaline earths or transition metals, cerium, zirconium, silver, aluminum, or magnesium that can form second phase nanoparticles that acts as pinning sites in an oxide superconductor film. In one or more embodiments, additive components may include stoichiometric excesses of soluble compounds included in the precursor solution as precursor components. For example, soluble yttrium salts may be included in the precursor solution in excess of that required to form Y123. The excess yttrium is processed according to one or more embodiments of the present invention to form yttrium-rich secondary phase nanoparticles, such as $Y_2BaCuO_5$ (Y211), $Y_2Cu_2O_5$ and/or $Y_2O_3$, which serve as particulate pinning sites in the superconducting oxide film. Generally, the additive compound can be any metal compound that is soluble in the solvent(s) contained in the precursor solution and that forms metal oxide or metal in the oxide superconductor film. Exemplary additive components include rare earth, alkaline metal or transition metal compounds in excess of or in addition to those of the precursor component. Soluble compounds of metal compounds used in the formation of nanoparticles refer to compounds of these metals, e.g., rare earths, such as yttrium, neodymium, samarium, europium, gadolinium, terbium, dysprosium, holmium, erbium, thulium, ytterbium, and lutetium, alkaline earth metals, such as calcium, barium and strontium, transition metals, such as scandium, titanium, vanadium, chromium, manganese, iron, cobalt, nickel and zirconium, cerium, silver, aluminum, and magnesium that are capable of dissolving in the solvents contained in the precursor solution. Such compounds include, for example, salts (e.g., nitrates, acetates, alkoxides, halides, sulfates, and trifluoroacetates), oxides and hydroxides of these metals. The additive component may also be to the precursor solution as a powder to form a nanoparticle dispersion.

Further information on suitable additive and dopants for use in precursor solutions is found in co-pending and commonly own United States patent application U.S. Ser. No. 10/758,710, and entitled "Oxide Films with Nanodot Flux Pinning Centers," which is hereby incorporated by reference.

The precursor layer can be deposited in a single step. For example, a precursor solution containing the constituent metals of YBCO and having a Cu to Ba ratio of greater than 1.5 is deposited at a thickness of at least 0.8 μm and the precursor film is decomposed in a water vapor environment to form a metal oxyfluoride film having a near stoichiometric Ba:Cu=2:3 content at the buffer/YBCO interface, an overall Cu to Ba ratio greater than 1.5, and an overall thickness of greater than 0.8 μm or greater than about 1.0 μm. The Cu to Ba ratio in the precursor solution can be achieved using a solution containing an excess of copper, a deficiency of barium, or both, and can be at least about 5 mol %, or at least about 20 mol %. By "excess" as that term is used herein it is meant the amount of metal in excess of the amount needed to prepare a precursor solution containing stoichiometric proportions of the constituent metals of an oxide superconductor. By "deficiency" as that term is used herein it is meant the amount of metal lacking in order to prepare a precursor solution containing stoichiometric proportions of the constituent metals of an oxide superconductor.

The precursor layer can be deposited in two or more steps and using two or more different precursor solutions, in which one or more of the steps provides a layer containing excess copper. The layer containing excess copper may be deposited using a copper-rich RE-123 precursor solution containing all constituent metals of an oxide superconductor, or it may be a copper-only precursor solution.

In one embodiment, the first precursor layer may be deposited on the substrate and decomposed before the second precursor layer is deposited and decomposed. In another embodiment, the precursor layers can be deposited in two or more steps and decomposed in a single step.

In one or more embodiments, a copper-containing layer may be disposed between the first and second RE-123 precursor layers. The first precursor layer may be deposited on the substrate and decomposed before the copper layer is deposited. Any interlayer should be structurally and chemically compatible with the precursor material and form, for example, a textured crystalline structure that permits the deposition of an epitaxial superconductor layer.

The interlayer is typically CuO or Cu2O, depending on the temperature. But because this layer is thin, and during conversion process at high temperature, this Cu oxide layer can diffuse into the upper or lower layers. After decomposition, this layer is observable under SEM, but after high temperature reaction to an oxide superconductor, this layer is no longer observed. Because Cu oxide diffuses into the matrix, the Cu content in the matrix is enriched.

The interlayer thickness is generally in the range of 20 nm to 200 nm, and is deposited, for example, by sputtering, evaporation deposition or pulsed vapor deposition, or other conventional methods. The layer may also be deposited as a soluble copper precursor that is decomposed to form copper oxide. During the necessary heat treatments to form the oxide superconductor, some or all of the copper from the interlayer diffuses into both precursor layers forming copper-rich superconductor layers.

In one embodiment, a YBCO film can be prepared by depositing a first layer of copper precursor solution, depositing a second layer of a YBCO precursor solution containing constituent metals Y, Ba, Cu at a ratio of about 1:2:3 (e.g., stoichiometric), where the overall composition of both layers provides an alkaline earth to transition metal ratio of greater than 1.5. The precursor film is decomposed in a water vapor environment to achieve a near stoichiometric Y:Ba:Cu=1:2:3 at the buffer/YBCO interface, an overall Cu to Ba ratio greater than 1.5, and an overall thickness of greater than about 0.8 μm or about 1.0 μm. The copper precursor solution can be deposited to provide an excess Cu content of at least about 5 mol %, or at least about 20 mol %, or at least about 30 mol %. The YBCO precursor solution may also contain an excess of copper (or deficiency of barium), in which case the amount of copper in the copper precursor layer is adjusted accordingly.

In another embodiment, a YBCO film can be prepared by depositing a layer of YBCO precursor solution with excess Cu content, a layer of Cu precursor solution, and a layer of YBCO precursor solution containing constituent metals Y, Ba, Cu at a ratio of about 1:2:3. The overall composition of the three layers provides a Cu:Ba ratio of greater than 1.5. Decomposition of the precursor film in water vapor environment provides a near stoichiometric Y:Ba:Cu=1:2:3 at the buffer/YBCO interface, an overall Cu to Ba ratio greater than 1.5, and an overall thickness of greater than about 0.8 μm or about 1.0 μm. Application of multiple thick layers provides a final YBCO film of exceptional thickness, while having attractive texture and current carrying ability.

In another embodiment, multiple layers of copper-rich (or barium-deficient) YBCO precursor solutions are deposited. A YBCO film can be prepared by depositing a YBCO precursor solution with excess Cu content, another YBCO layer of precursor solution with excess Cu content, and decomposing the precursor film in water vapor environment to achieve a near stoichiometric Ba:Cu=2:3 at the buffer/YBCO interface, an overall Cu to Ba ratio greater than 1.5, and an overall thickness of greater than 0.8 μm. Application of multiple thick layers provides a final YBCO film of exceptional thickness, while having attractive texture and current carrying ability.

In another embodiment, a YBCO film can be prepared by depositing a first layer of YBCO precursor solution, a second layer of YBCO precursor solution with excess Cu (or barium-deficient) content, and decomposing the precursor film in water vapor environment to achieve a near stoichiometric Ba:Cu=2:3 at the buffer/YBCO interface, an overall Cu to Ba ratio greater than 1.5, and an overall thickness of greater than 0.8 μm. Application of multiple thick layers provides a final YBCO film of exceptional thickness, while having attractive texture and current carrying ability.

In another embodiment, a YBCO film can be prepared by depositing a first layer of YBCO precursor solution with excess Cu (or barium-deficient) content and decomposing the precursor film in water vapor environment to achieve a near stoichiometric Ba:Cu=2:3 at the buffer/YBCO interface and depositing a second layer of a YBCO precursor solution containing constituent metals Y, Ba, Cu at a ratio of about 1:2:3 (e.g., stoichiometric) or containing excess copper (or barium-deficient) content in which a portion of the yttrium is partially substituted by a a dopant source, and decomposing the precursor film in water vapor environment to achieve an intermediate film containing a dopant. The overall Cu to Ba ratio greater than 1.5, and the overall thickness of the intermediate layer is greater than 0.8 μm. Application of multiple thick layers provides a final YBCO film of exceptional thickness and including a layer containing flux pinning sites, while having attractive texture and current carrying ability.

In another embodiment, a YBCO film can be prepared by depositing a first layer of YBCO precursor solution with excess Cu (or barium-deficient) content and decomposing the precursor film in water vapor environment to achieve a near stoichiometric Ba:Cu=2:3 at the buffer/YBCO interface and depositing a second layer of a YBCO precursor solution containing constituent metals Y, Ba, Cu at a ratio of about 1:2:3 (e.g., stoichiometric) or containing excess copper (or barium-deficient) content and further containing an additive or dopant that forms secondary nanoparticle phases under conditions used to form an oxide superconductor. The overall Cu to Ba ratio greater than 1.5, and the overall thickness of the intermediate layer is greater than 0.8 μm. The layers provide a film of exceptional thickness and include a layer having secondary phase nanoparticles.

The precursor solutions having an alkaline earth to transition metal ratio of greater than 1.5 are deposited in an amount sufficient to provide a fully reacted oxide superconductor film at overall thicknesses at least 0.8 μm. The solutions can be deposited at greater thickness, for example, to provide fully reacted oxide superconductor films at thicknesses of at least 1.0 μm, or 0.8-3.0 μm. By applying multiple layers of the precursor solutions, final thicknesses of up to 3 μm without degradation of texture or current carrying ability are contemplated.

Superconducting films prepared from the precursor solutions and methods described above have shown improvement in critical current. The critical current of the superconductor film having a YBCO thickness of about 1 μm is in the range of about 200 Amps/cmW to about 250 Amps/cmW.

Suitable precursor components include soluble compounds of one or more rare earth elements, one or more alkaline earth metals and one or more transition metals. As used herein, "soluble compounds" of rare earth elements, alkaline earth metals and transition metals refers to compounds of these metals that are capable of dissolving in the solvents contained in the precursor solution. Such compounds include, for example, salts (e.g., nitrates, acetates, alkoxides, halides, sulfates, and trifluoroacetates), oxides and hydroxides of these metals. At least one of the compounds is a fluorine-containing compound, such as the trifluoroacetate.

In general, the rare earth metal salt can be any rare earth metal salt that is soluble in the solvent(s) contained in the precursor solution and that, when being processed to form an intermediate (e.g., a metal oxyhalide intermediate), forms rare earth oxide(s) (e.g., $Y_2O_3$). The rare earth elements may be selected from the group of yttrium, cerium, neodymium, samarium, europium, gadolinium, terbium, dysprosium, holmium, erbium, thulium, ytterbium, and lutetium. Typically, the alkaline earth metal is barium, strontium or calcium. Generally, the alkaline earth metal salt can be any alkaline earth metal salt that is soluble in the solvent(s) contained in the precursor solution and that, when being processed to form an intermediate (e.g., a metal oxyhalide intermediate), forms an alkaline earth halide compound (e.g., $BaF_2$, $BaCl_2$, $BaBr_2$, $BaI_2$) prior to forming alkaline earth oxide(s) (e.g., BaO). Generally, the transition metal is copper. The transition metal salt should be soluble in the solvent(s) contained in the precursor solution. In one or more embodiments of the present invention, the rare earth and the alkaline earth elements can form a metal or mixed metal oxyfluoride in place of or in addition to a rare earth oxide and an alkaline earth fluoride.

Suitable copper precursor solutions contain a copper salt that is soluble at the appropriate concentration in the solvent (s). Such compounds include copper nitrates, acetates, alkoxides, halides, sulfates or trifluoroacetates. A suitable compound is copper proprionate.

In one embodiment, the precursor solution includes yttrium, barium and copper wherein the ratio of Cu to Ba is greater than about 1.5. In another embodiment, the precursor solution includes yttrium, barium and copper wherein the ratio of Cu to Ba is at least 1.6. In another embodiment, the precursor solution includes yttrium, barium and copper wherein the ratio of Cu to Ba is at least 1.8.

The solvent or combination of solvents used in the precursor solution can include any solvent or combination of solvents capable of dissolving the metal salts (e.g., metal carboxylate(s)). Such solvents include, for example, alcohols, including methanol, ethanol, isopropanol and butanol.

In embodiments in which the metal salt solution contains trifluoroacetate ion and an alkaline earth metal cation (e.g., barium), the total amount of trifluoroacetate ion can be selected so that the mole ratio of fluorine contained in the metal salt solution (e.g., in the form of trifluoroacetate) to the alkaline earth metal (e.g., barium ions) contained in the metal salt solution is at least about 2:1 (e.g., from about 2:1 to about 18.5:1, or from about 2:1 to about 10:1).

Figure 4:
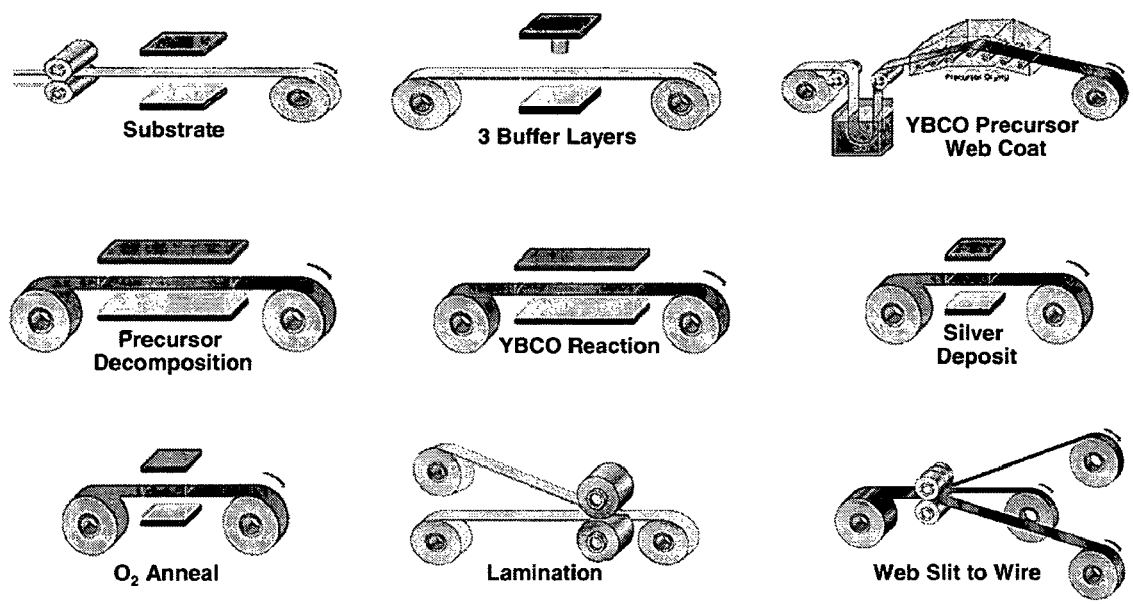
FIG. 4 is a schematic illustration of a system and process used to prepare a textured, patterned oxide superconductor wire according to one or more embodiments of the invention.

The methods of disposing the superconducting composition on the underlying layer (e.g., on a surface of a substrate, such as a substrate having an alloy layer with one or more buffer layers disposed thereon) include spin coating, dip coating, slot coating, web coating and other techniques known in the art. A web coating method of depositing the precursor film on a textured template having the architecture $CeO_2$/YSZ/ $Y_2O_3$/NiW is shown in FIG. 4. The textured template is provided in widths of about 1 to 10 cm.

As shown in FIG. 4, at a first station 410, a wire substrate is treated to obtain biaxial texture. Preferably, the substrate surface has a relatively well defined crystallographic orientation. For example, the surface can be a biaxially textured surface (e.g., a (113)[211] surface) or a cube textured surface (e.g., a (100)[011] surface or a (100)[001] surface). Preferably, the peaks in an X-ray diffraction pole figure of surface 110 have a FWHM of less than about 20° (e.g., less than about 15°, less than about 10°, or from about 5° to about 10°).

The surface can be prepared, for example, by rolling and annealing. Surfaces can also be prepared using vacuum processes, such as ion beam assisted deposition, inclined substrate deposition and other vacuum techniques known in the art to form a biaxially textured surface on, for example, a randomly oriented polycrystalline surface. In certain embodiments (e.g., when ion beam assisted deposition is used), the surface of the substrate need not be textured (e.g., the surface can be randomly oriented polycrystalline, or the surface can be amorphous).

The substrate can be formed of any material capable of supporting a buffer layer stack and/or a layer of superconductor material. Examples of substrate materials that can be used as the substrate include for example, metals and/or alloys, such as nickel, silver, copper, zinc, aluminum, iron, chromium, vanadium, palladium, molybdenum and/or their alloys. In some embodiments, the substrate can be formed of a superalloy. In certain embodiments, the substrate can be in the form of an object having a relatively large surface area (e.g., a tape or a wafer). In these embodiments, the substrate is preferably formed of a relatively flexible material.

In some of these embodiments, the substrate is a binary alloy that contains two of the following metals: copper, nickel, chromium, vanadium, aluminum, silver, iron, palladium, molybdenum, tungsten, gold and zinc. For example, a binary alloy can be formed of nickel and chromium (e.g., nickel and at most 20 atomic percent chromium, nickel and from about five to about 18 atomic percent chromium, or nickel and from about 10 to about 15 atomic percent chromium). As another example, a binary alloy can be formed of nickel and copper (e.g., copper and from about five to about 45 atomic percent nickel, copper and from about 10 to about 40 atomic percent nickel, or copper and from about 25 to about 35 atomic percent nickel). As a further example, a binary alloy can contain nickel and tungsten (e.g., from about one atomic percent tungsten to about 20 atomic percent tungsten, from about two atomic percent tungsten to about 10 atomic percent tungsten, from about three atomic percent tungsten to about seven atomic percent tungsten, about five atomic percent tungsten). A binary alloy can further include relatively small amounts of impurities (e.g., less than about 0.1 atomic percent of impurities, less than about 0.01 atomic percent of impurities, or less than about 0.005 atomic percent of impurities).

In certain of these embodiments, the substrate contains more than two metals (e.g., a ternary alloy or a quarternary alloy). In some of these embodiments, the alloy can contain one or more oxide formers (e.g., Mg, Al, Ti, Cr, Ga, Ge, Zr, Hf, Y, Si, Pr, Eu, Gd, Th, Dy, Ho, Lu, Th, Er, Tm, Be, Ce, Nd, Sm, Yb and/or La, with Al being the preferred oxide former), as well as two of the following metals: copper, nickel, chromium, vanadium, aluminum, silver, iron, palladium, molybdenum, gold and zinc. In certain of these embodiments, the alloy can contain two of the following metals: copper, nickel, chromium, vanadium, aluminum, silver, iron, palladium, molybdenum, gold and zinc, and can be substantially devoid of any of the aforementioned oxide formers.

In embodiments in which the alloys contain an oxide former, the alloys can contain at least about 0.5 atomic percent oxide former (e.g., at least about one atomic percent oxide former, or at least about two atomic percent oxide former) and at most about 25 atomic percent oxide former (e.g., at most about 10 atomic percent oxide former, or at most about four atomic percent oxide former). For example, the alloy can include an oxide former (e.g., at least about 0.5 aluminum), from about 25 atomic percent to about 55 atomic percent nickel (e.g., from about 35 atomic percent to about 55 atomic percent nickel, or from about 40 atomic percent to about 55 atomic percent nickel) with the balance being copper. As another example, the alloy can include an oxide former (e.g., at least about 0.5 atomic aluminum), from about five atomic percent to about 20 atomic percent chromium (e.g., from about 10 atomic percent to about 18 atomic percent chromium, or from about 10 atomic percent to about 15 atomic percent chromium) with the balance being nickel. The alloys can include relatively small amounts of additional metals (e.g., less than about 0.1 atomic percent of additional metals, less than about 0.01 atomic percent of additional metals, or less than about 0.005 atomic percent of additional metals).

A substrate formed of an alloy can be produced by, for example, combining the constituents in powder form, melting and cooling or, for example, by diffusing the powder constituents together in solid state. The alloy can then be formed by deformation texturing (e.g, annealing and rolling, swaging, extrusion and/or drawing) to form a textured surface (e.g., biaxially textured or cube textured). Alternatively, the alloy constituents can be stacked in a jelly roll configuration, and then deformation textured. In some embodiments, a material with a relatively low coefficient of thermal expansion (e.g, Nb, Mo, Ta, V, Cr, Zr, Pd, Sb, NbTi, an intermetallic such as NiAl or $Ni_3Al$, or mixtures thereof) can be formed into a rod and embedded into the alloy prior to deformation texturing.

In some embodiments, stable oxide formation at the surface can be mitigated until a first epitaxial (for example, buffer) layer is formed on the biaxially textured alloy surface, using an intermediate layer disposed on the surface of the substrate. Intermediate layers include those epitaxial metal or alloy layers that do not form surface oxides when exposed to conditions as established by $PO_2$ and temperature required for the initial growth of epitaxial buffer layer films. In addition, the buffer layer acts as a barrier to prevent substrate element(s) from migrating to the surface of the intermediate layer and forming oxides during the initial growth of the epitaxial layer. Absent such an intermediate layer, one or more elements in the substrate would be expected to form thermodynamically stable oxide(s) at the substrate surface which could significantly impede the deposition of epitaxial layers due to, for example, lack of texture in this oxide layer.

In some of these embodiments, the intermediate layer is transient in nature. "Transient," as used herein, refers to an intermediate layer that is wholly or partly incorporated into or with the biaxially textured substrate following the initial nucleation and growth of the epitaxial film. Even under these circumstances, the intermediate layer and biaxially textured substrate remain distinct until the epitaxial nature of the deposited film has been established. The use of transient intermediate layers may be preferred when the intermediate layer possesses some undesirable property, for example, the intermediate layer is magnetic, such as nickel.

Exemplary intermediate metal layers include nickel, gold, silver, palladium, and alloys thereof. Additional metals or alloys may include alloys of nickel and/or copper. Epitaxial films or layers deposited on an intermediate layer can include metal oxides, chalcogenides, halides, and nitrides. In some embodiments, the intermediate metal layer does not oxidize under epitaxial film deposition conditions.

Care should be taken that the deposited intermediate layer is not completely incorporated into or does not completely diffuse into the substrate before nucleation and growth of the initial buffer layer structure causes the epitaxial layer to be established. This means that after selecting the metal (or alloy) for proper attributes such as diffusion constant in the substrate alloy, thermodynamic stability against oxidation under practical epitaxial buffer layer growth conditions and lattice matching with the epitaxial layer, the thickness of the deposited metal layer has to be adapted to the epitaxial layer deposition conditions, in particular to temperature.

Deposition of the intermediate metal layer can be done in a vacuum process such as evaporation or sputtering, or by electro-chemical means such as electroplating (with or without electrodes). These deposited intermediate metal layers may or may not be epitaxial after deposition (depending on substrate temperature during deposition), but epitaxial orientation can subsequently be obtained during a post-deposition heat treatment.

In certain embodiments, sulfur can be formed on the surface of the intermediate layer. The sulfur can be formed on the surface of the intermediate layer, for example, by exposing the intermediate layer to a gas environment containing a source of sulfur (e.g., $H_2S$, a tantalum foil or a silver foil) and hydrogen (e.g., hydrogen, or a mix of hydrogen and an inert gas, such as a 5% hydrogen/argon gas mixture) for a period of time (e.g., from about 10 seconds to about one hour, from about one minute to about 30 minutes, from about five minutes to about 15 minutes). This can be performed at elevated temperature (e.g., at a temperature of from about 450° C. to about 1100° C., from about 600° C. to about 900° C., 850° C.). The pressure of the hydrogen (or hydrogen/inert gas mixture) can be relatively low (e.g., less than about one torr, less than about 1×10−3 torr, less than about 1×10−6 torr) or relatively high (e.g., greater than about 1 torr, greater than about 100 torr, greater than about 760 torr).

Without wishing to be bound by theory, it is believed that exposing the textured substrate surface to a source of sulfur under these conditions can result in the formation of a superstructure (e.g., a c(2×2) superstructure) of sulfur on the textured substrate surface. It is further believed that the superstructure can be effective in stabilizing (e.g., chemically and/or physically stabilizing) the surface of the intermediate layer.

While one approach to forming a sulfur superstructure has been described, other methods of forming such superstructures can also be used. For example, a sulfur superstructure (e.g., S c(2×2)) can be formed by applying an appropriate organic solution to the surface of the intermediate layer by heating to an appropriate temperature in an appropriate gas environment.

Moreover, while formation of a sulfur superstructure on the surface of the intermediate layer has been described, it is believed that other superstructures may also be effective in stabilizing (e.g., chemically and/or physically stabilizing) the surface. For example, it is believed that an oxygen superstructure, a nitrogen superstructure, a carbon superstructure, a potassium superstructure, a cesium superstructure, a lithium superstructure or a selenium superstructure disposed on the surface may be effective in enhancing the stability of the surface In a second processing station 420, a buffer layer is formed on the textured substrate. The buffer layer can be formed using ion beam assisted deposition (IBAD). In this technique, a buffer layer material is evaporated using, for example, electron beam evaporation, sputtering deposition, or pulsed laser deposition while an ion beam (e.g., an argon ion beam) is directed at a smooth amorphous surface of a substrate onto which the evaporated buffer layer material is deposited.

For example, the buffer layer can be formed by ion beam assisted deposition by evaporating a buffer layer material having a rock-salt like structure (e.g., a material having a rock salt structure, such as an oxide, including MgO, or a nitride) onto a smooth, amorphous surface (e.g., a surface having a root mean square roughness of less than about 100 Angstroms) of a substrate so that the buffer layer material has a surface with substantial alignment (e.g., about 13° or less), both in-plane and out-of-plane.

The conditions used during deposition of the buffer layer material can include, for example, a substrate temperature of from about 0° C. to about 750° C. (e.g., from about 0° C. to about 400° C., from about room temperature to about 750° C., from about room temperature to about 400° C.), a deposition rate of from about 1.0 Angstrom per second to about 4.4 Angstroms per second, an ion energy of from about 200 eV to about 1200 eV, and/or an ion flux of from about 110 microamperes per square centimeter to about 120 microamperes per square centimeter.

In some embodiments, when using IBAD, the substrate is formed of a material having a polycrystalline, non-amorphous base structure (e.g., a metal alloy, such as a nickel alloy) with a smooth amorphous surface formed of a different material (e.g., $Si_3N_4$).

In certain embodiments, a plurality of buffer layers can be deposited by epitaxial growth on an original IBAD surface. Each buffer layer can have substantial alignment (e.g., about 13° or less), both in-plane and out-of-plane.

A buffer material can be prepared using solution phase techniques, including metalorganic deposition, such as disclosed in, for example, S. S. Shoup et al., J. Am. Cer. Soc., vol. 81, 3019; D. Beach et al., Mat. Res. Soc. Symp. Proc., vol. 495, 263 (1988); M. Paranthaman et al., Superconductor Sci. Tech., vol. 12, 319 (1999); D. J. Lee et al., Japanese J. Appl. Phys., vol. 38, L178 (1999) and M. W. Rupich et al., I.E.E.E. Trans. on Appl. Supercon. vol. 9, 1527. In certain embodiments, solution coating processes can be used for deposition of one or a combination of any of the oxide layers on textured substrates; however, they can be particularly applicable for deposition of the initial (seed) layer on a textured metal substrate. The role of the seed layer is to provide 1) protection of the substrate from oxidation during deposition of the next oxide layer when carried out in an oxidizing atmosphere relative to the substrate (for example, magnetron sputter deposition of yttria-stabilized zirconia from an oxide target); and 2) an epitaxial template for growth of subsequent oxide layers. In order to meet these requirements, the seed layer should grow epitaxially over the entire surface of the metal substrate and be free of any contaminants that may interfere with the deposition of subsequent epitaxial oxide layers.

The formation of oxide buffer layers can be carried out so as to promote wetting of an underlying substrate layer. Additionally, in particular embodiments, the formation of metal oxide layers can be carried out using metal alkoxide precursors (for example, "sol gel" precursors).

Once the textured substrate including buffer layers is prepared, a precursor solution is deposited at a station 430 as described above. As noted above, one or more layers are deposited to form a precursor layer having the desired thickness and overall composition.

At a subsequent station 440, the precursor components are decomposed. The conversion of the precursor components into an oxide superconductor is carried out as has been previously reported for continuous thick precursor films. In the case of precursor components including at least one fluoride-containing salt, the first step of the heating step is performed to decompose the metalorganic molecules to one or more oxyfluoride intermediates of the desired superconductor material.

Typically, the initial temperature in this step is about room temperature, and the final temperature is from about 190° C. to about 210° C., preferably to a temperature to about 200° C. Preferably, this step is performed using a temperature ramp of at least about 5° C. per minute, more preferably a temperature ramp of at least about 10° C. per minute, and most preferably a temperature ramp of at least about 15° C. per minute. During this step, the partial pressure of water vapor in the nominal gas environment is preferably maintained at from about 5 Torr to about 50 Torr, more preferably at from about 5 Torr to about 30 Torr, and most preferably at from about 20 Torr to about 30 Torr. The partial pressure of oxygen in the nominal gas environment is maintained at from about 0.1 Torr to about 760 Torr and preferably at about 730-740 Torr.

Heating is then continued to a temperature of from about 200° C. to about 290° C. using a temperature ramp of from about 0.05° C. per minute to about 5° C. per minute (e.g., from about 0.5° C. per minute to about 1° C. per minute). Preferably, the gas environment during this heating step is substantially the same as the nominal gas environment used when the sample is heated to from the initial temperature to from about 190° C. to about 215° C.

Heating is further continued to a temperature of about 650° C., or more preferably to a temperature of about 400° C., to form the oxyfluoride intermediate. This step is preferably performed using a temperature ramp of at least about 2° C. per minute, more preferably at least about 3° C. per minute, and most preferably at least about 5° C. per minute. Preferably, the gas environment during this heating step is substantially the same as the nominal gas environment used when the sample is heated to from the initial temperature to from about 190° C. to about 215° C.

In alternate embodiments, barium fluoride is formed by heating the dried solution from an initial temperature (e.g., room temperature) to a temperature of from about 190° C. to about 215° C. (e.g., about 210° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. In these embodiments, heating is then continued to a temperature of from about 220° C. to about 290° C. (e.g., about 220° C.) in a water vapor pressure of from about 5 Torr to about 50 Torr water vapor (e.g., from about 5 Torr to about 30 Torr water vapor, or from about 10 Torr to about 25 Torr water vapor). The nominal partial pressure of oxygen can be, for example, from about 0.1 Torr to about 760 Torr. This is followed by heating to about 400° C. at a rate of at least about 2° C. per minute (e.g., at least about 3° C. per minute, or at least about 5° C. per minute) in a water vapor pressure of from about 5 Torr to about 50 Torr water vapor (e.g., from about 5 Torr to about 30 Torr water vapor, or from about 10 Torr to about 25 Torr water vapor) to form barium fluoride. The nominal partial pressure of oxygen can be, for example, from about 0.1 Torr to about 760 Torr.

In certain embodiments, heating the dried solution to form barium fluoride can include putting the coated sample in a pre-heated furnace (e.g., at a temperature of at least about 100° C., at least about 150° C., at least about 200° C., at most about 300° C., at most about 250° C., about 200° C.). The gas environment in the furnace can have, for example, a total gas pressure of about 760 Torr, a predetermined partial pressure of water vapor (e.g. at least about 10 Torr, at least about 15 Torr, at most about 25 Torr, at most about 20 Torr, about 17 Torr) with the balance being molecular oxygen. After the coated sample reaches the furnace temperature, the furnace temperature can be increased (e.g., to at least about 225° C., to at least about 240° C., to at most about 275° C., to at most about 260° C., about 250° C.) at a predetermined temperature ramp rate (e.g., at least about 0.5° C. per minute, at least about 0.75° C. per minute, at most about 2° C. per minute, at most about 1.5° C. per minute, about 1° C. per minute). This step can be performed with the same nominal gas environment used in the first heating step. The temperature of the furnace can then be further increased (e.g., to at least about 350° C., to at least about 375° C., to at most about 450° C., to at most about 425° C., about 450° C.) at a predetermined temperature ramp rate (e.g., at least about 5° C. per minute, at least about 8° C. per minute, at most about 20° C. per minute, at most about 12° C. per minute, about 10° C. per minute). This step can be performed with the same nominal gas environment used in the first heating step.

The foregoing treatments of a metal salt solution can result in an oxyfluoride intermediate film in which the constituent metal oxides and metal fluorides are homogeneously distributed throughout the film. Preferably, the precursor has a relatively low defect density and is essentially free of cracks through the intermediate thickness. While solution chemistry for barium fluoride formation has been disclosed, other methods can also be used for other precursor solutions.

The superconductor intermediate film can then be heated to form the desired superconductor layer at a further processing station 450. Typically, this step is performed by heating from about room temperature to a temperature of from about 700° C. to about 825° C., preferably to a temperature of about 740° C. to 800° C. and more preferably to a temperature of about 750° C. to about 790° C., at a temperature ramp of about greater than 25° C. per minute, preferably at a temperature rate of about greater than 100° C. per minute and more preferably at a temperature rate about greater than 200° C. per minute. This step can also start from the final temperature of about 400-650° C. used to form the intermediate oxyfluoride film. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then held at a temperature of about 700° C.-825° C., preferably to a temperature of about 740° C. to 800° C. and more preferably to a temperature of about 750° C. to about 790° C., for a time of about at least 5 minutes to about 120 minutes, preferably for a time of at least about 15 minutes to about 60 minutes, and more preferably for a time of at least about 15 minutes to about 30 minutes. During this step, a process gas is flowed over the film surface to supply the gaseous reactants to the film and to remove the gaseous reaction products from the film. The nominal gas environment during this step has a total pressure of about 0.1 Torr to about 760 Torr and is comprised of about 0.09 Torr to about 50 Torr oxygen and about 0.01 Torr to about 150 Torr water vapor and about 0 Torr to about 750 Torr of an inert gas (nitrogen or argon). More preferably, the nominal gas environment has a total pressure of about 0.15 Torr to about 5 Torr and is comprised of about 0.1 Torr to about 1 Torr oxygen and about 0.05 Torr to about 4 Torr water vapor.

The film is then cooled to room temperature in a nominal gas environment with an oxygen pressure of about 0.05 Torr to about 150 Torr, preferably about 0.1 Torr to about 0.5 Torr and more preferably from about 0.1 Torr to about 0.2 Torr.

The resultant superconductor layer is well-ordered (e.g., biaxially textured in plane, or c-axis out of plane and biaxially textured in plane). In embodiments, the bulk of the superconductor material is biaxially textured. A superconductor layer can be at least about one micrometer thick (e.g., at least about two micrometers thick, at least about three micrometers thick, at least about four micrometers thick, at least about five micrometers thick). The oxide superconductor has a c-axis orientation that is substantially constant across its width, the c-axis orientation of the superconductor being substantially perpendicular to the surface of the wire or tape.

Further processing by noble metal deposition at station 460, oxygen anneal at station 470, lamination at station 480 and slitting at station 490 complete the process, thereby allowing for the low cost fabrication of low ac loss coated conductor wires. The present invention is more particularly described in the following examples, which are intended as illustrative only, since numerous modifications and variations will be apparent to those skilled in the art.

EXAMPLE 1

Preparation of Y123 Film

A YBCO precursor solution having a stoichiometry of Y:Ba:Cu of 1:2:3 was prepared by dissolving about 0.83 grams of $Y(CF_3CO_2)_3$, about 1.60 grams of $Ba(CF_3CO_2)_2$ and about 1.28 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor solution was deposited by a spin coating technique, at a speed of 2000 RPM, on a length (1.5 cm to 2 cm) of 1 cm wide biaxially textured oxide buffered metallic substrate with the structure Ni(5 at %)W/$Y_2O_3$/YSZ/$CeO_2$. A sufficient quantity of precursor solution was deposited to produce about a 0.8 μm thick $YBa_2Cu_3O_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 torr (water vapor pressure of about 24 torr and balance oxygen).

The metal oxyfluoride film was then heat treated to form an oxide superconductor. A short length (1-2 cm) of the intermediate film was heated in a tube furnace to about 785° C. at a rate of about 200° C. per minute and held for about 30 min in an environment having a total gas pressure of about 240 mtorr (water vapor pressure of about 90 mtorr, and oxygen gas pressure of about 150 mtorr). After 30 min holding, the $H_2O$ vapor removed from the gas environment and the film was then cooled to room temperature in about 150 mtorr $O_2$. The resulting film and was about 0.8 micron thick.

The sample was then coated with 2 μm thick Ag layer by thermal evaporation and annealed at 550° C. for 30 min in 100% O2 and then furnace cooled to room temperature.

EXAMPLE 2

Preparation of Y123 Film with Excess Cu

A YBCO precursor solution having a stoichiometry of Y:Ba:Cu of 1:2:3.34 was prepared by dissolving about 0.83 grams of $Y(CF_3CO_2)_3$, about 1.60 grams of $Ba(CF_3CO_2)_2$ and about 1.54 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

Figure 5:
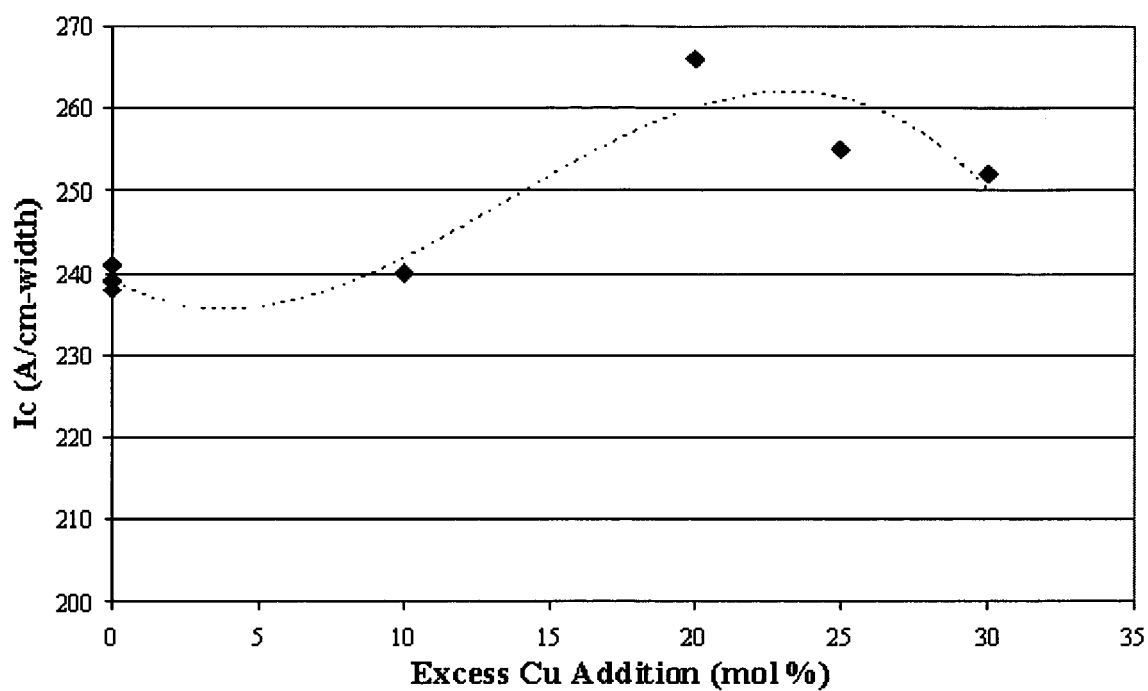
FIG. 5 shows Ic as a function of excess Cu addition to YBCO.

The precursor was coated, decomposed and processed as described in Example 1. The resulting film and was about 0.8 micron thick. The preparation was repeated with various excess Cu concentrations. FIG. 5 shows that as the Cu concentration increases the Ic also increases up to ~20% excess Cu, after which the Ic begins to decrease.

EXAMPLE 3

Preparation of Y123 Film with Excess Cu and Deficient Ba

A YBCO precursor solution having a stoichiometry of Y:Ba:Cu of 1:1.6:3.6 was prepared by dissolving about 0.83 grams of $Y(CF_3CO_2)_3$, about 1.28 grams of $Ba(CF_3CO_2)_2$ and about 2.3 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor was coated, decomposed and processed as described in Example 1. The resulting film and was about 0.8 micron thick. The critical current of the final film was found to be 219 A/cmW.

EXAMPLE 4

Preparation of Y123 Film with a Cu Layer Prior to a Stoichiometric Solution Layer A YBCO precursor solution having a stoichiometry of Y:Ba:Cu of 1:2:3 was prepared by dissolving about 0.83 grams of $Y(CF_3CO_2)_3$, about 1.60 grams of $Ba(CF_3CO_2)_2$ and about 1.28 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

A Cu precursor solution was prepared by dissolving about 1.54 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The Cu precursor solution was deposited by a spin coating technique, at a speed of about 1000-3000 RPM, on a length (1.5 cm to 2 cm) of 1 cm wide biaxially textured oxide buffered metallic substrate with the structure Ni(5 at %)W/$Y_2O_3$/YSZ/$CeO_2$. A sufficient quantity of precursor solution was deposited to obtain sufficient thickness of Cu film.

The YBCO precursor solution was then deposited by a spin coating technique, at a speed of 2000 RPM, on the Cu film. A sufficient quantity of precursor solution was deposited to produce about a 0.8 μm thick $YBa_2Cu_3O_{7-x}$ film.

Figure 6:
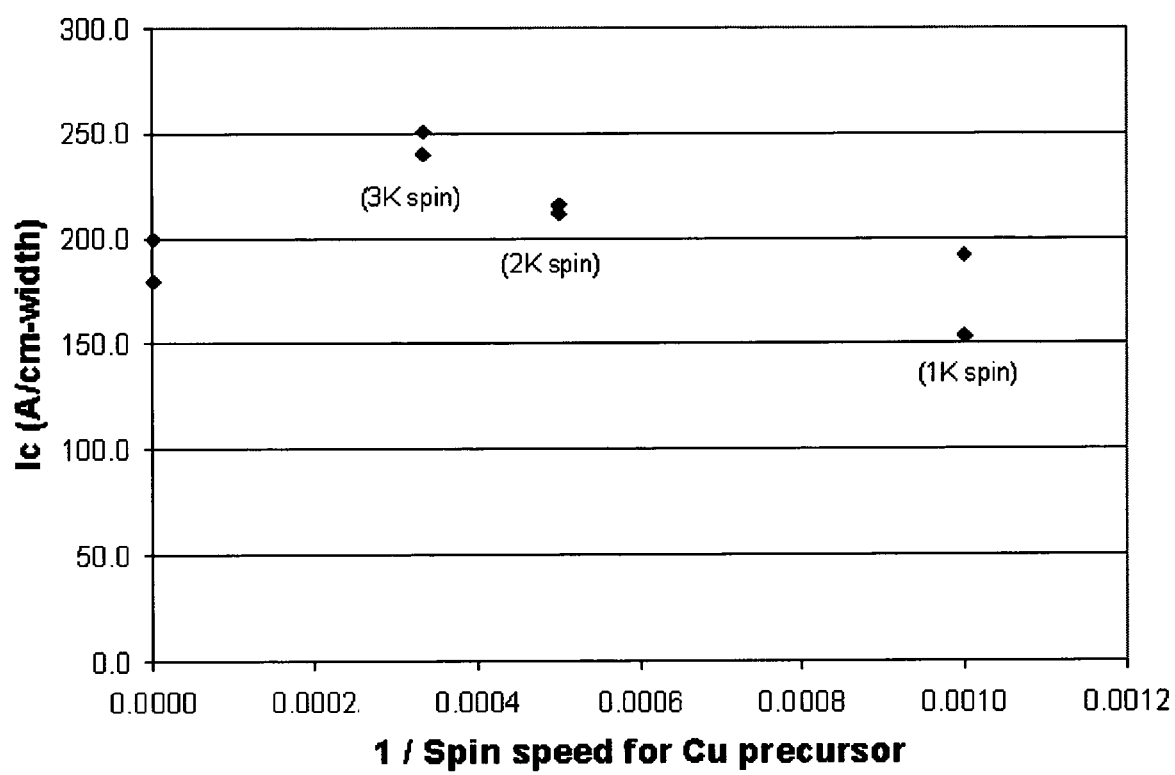
FIG. 6 shows Ic as a function of spin speed for the addition Cu precursor solution.

The coated sample was decomposed and processed as described in Example 1. The resulting film and was about 0.8 micron thick. FIG. 6 shows that the critical current of the film at 77K, self field, increases with increasing spin speed, but decreases when there is no additional Cu layer.

EXAMPLE 5

Preparation of Y123 Film with Double Layer Coating with Stoichiometric Solutions A YBCO precursor solution having a stoichiometry of Y:Ba:Cu of 1:2:3 was prepared by dissolving about 0.83 grams of $Y(CF_3CO_2)_3$, about 1.60 grams of $Ba(CF_3CO_2)_2$ and about 1.28 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The YBCO precursor solution was deposited by a slot die coating technique on a length (1 meter) of 1 cm wide biaxially textured oxide buffered metallic substrate with the structure Ni(5 at %)W/$Y_2O_3$/YSZ/$CeO_2$. A sufficient quantity of precursor solution was deposited to produce about a 0.8 μm thick $YBa_2Cu_3O_{7-x}$ film. The coated sample was decomposed by a reel to reel system with the temperature profile and atmosphere as described in Example 1.

The decomposed tape was cut into two 0.5 m pieces. A second layer of YBCO precursor solution having a stoichiometry of Y:Ba:Cu of 1:2:3 was deposited by a slot die coating technique, on the first 0.5 m decomposed tape. A sufficient quantity of precursor solution was deposited to produce about a 0.6 μm thick $YBa_2Cu_3O_{7-x}$ film. The coated sample was decomposed and processed by the reel to reel system as described above, except for $P_{H2O}$ during decomposition which is 7 torr in the second layer decomposition with the balance being oxygen.

The decomposed tape was cut into 1 cm×2 cm piece and processed in a static furnace. The samples was first heated to 580° C. in 150 mtorr $O_2$ and 300 mtorr $H_2O$ atmosphere, the $O_2$ flow rate is 11 cc/min and $H_2O$ flow rate is adjusted through a leak valve to achieve the desired p$H_2O$. The heating rate is about 200° C./min. The sample was held for 10 min and than $H_2O$ was turned off. The sample was cooled down to room temperature in the dry 150 mtorr $O_2$ atmosphere.

The sample was then heated to 785° C. by the heating rate about 200° C./min in an dry 150 mtorr $O_2$. Once the sample reached the holding temperature of 785° C., 200 mtorr $H_2O$ vapor was introduced to convert the precursors to $YBa_2Cu_3O_x$ phase. The holding time is about 60 min. After 60 min holding, the $H_2O$ was turned off and the sample was cooled down in 150 mtorr dry $O_2$ to room temperature.

The sample was then Ag coated and $O_2$ annealed as described in Example 1.

Figure 7:
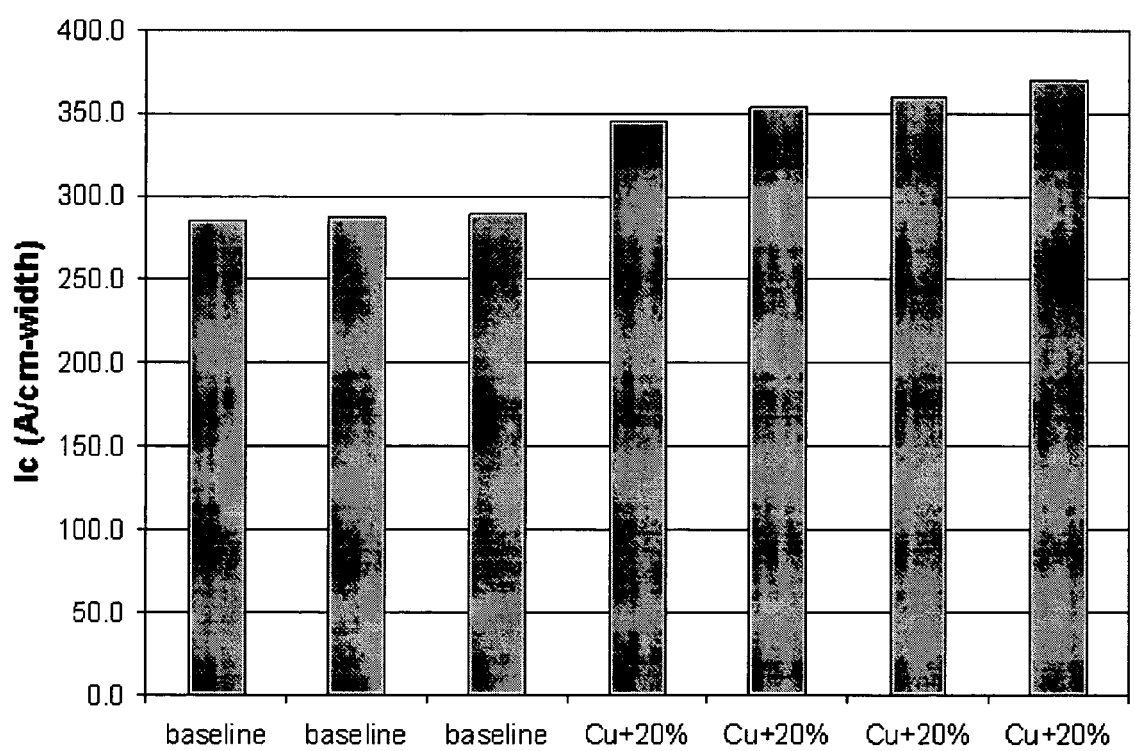
FIG. 7 shows measured Ic for double layers of YBCO film and for double layers of YBCO film with excess Cu in the second layer.

The critical current of the final film was measured by four probe method at 77K, self field. The measured critical currents are shown in FIG. 7 and are labeled as "baseline" in the figure.

EXAMPLE 6

Preparation of Y123 Film with Double Layer Coating with Excess Cu Solution in the Second Layer A second YBCO precursor solution having a stoichiometry of Y:Ba:Cu of 1:2:3.6 was prepared by dissolving about 0.83 grams of $Y(CF_3CO_2)_3$, about 1.60 grams of $Ba(CF_3CO_2)_2$ and about 1.54 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The second YBCO precursor solution was deposited by a slot die coating technique on the second piece of 0.5 m long decomposed precursor tape as mentioned in Example 5. A sufficient quantity of precursor solution was deposited to produce about a 0.6 μm thick $YBa_2Cu_3O_{7-x}$ film. The coated sample was decomposed and processed as described in Example 5.

The decomposed tape was cut into 1 cm×2 cm piece and processed in a static furnace. The samples was first heated to 580° C. in 150 mtorr $O_2$ and 300 mtorr $H_2O$ atmosphere, the $O_2$ flow rate is 11 cc/min and $H_2O$ flow rate is adjusted through a leak valve to achieve the desired p$H_2O$. The heating rate is about 200° C./min. The sample was held for 10 min and than $H_2O$ was turned off. The sample was cooled down to room temperature in the dry 150 mtorr $O_2$ atmosphere.

The sample was then heated to 785° C. by the heating rate about 200° C./min in an dry 150 mtorr $O_2$. Once the sample reached the holding temperature of 785° C., 200 mtorr $H_2O$ vapor was introduced to convert the precursors to $YBa_2Cu_3O_x$ phase. The holding time is about 60 min. After 60 min holding, the $H_2O$ was turned off and the sample was cooled down in 150 mtorr dry $O_2$ to room temperature.

The sample was then Ag coated and $O_2$ annealed as described in Example 1.

The critical current of the final film was measured by four probe method at 77K, self field. The measured critical currents are shown in FIG. 7 and are labeled as "Cu+20%" in the figure.

EXAMPLE 7

Preparation of a Dy-Y123 Superconducting Film with 15 mol % Excess Cu and 50% Dy Addition A precursor solution was prepared by dissolving about 0.83 grams of $Y(CF_3CO_2)_3$, about 0.336 grams of $Dy(CH_3CO_2)_3$, about 1.60 grams of $Ba(CF_3CO_2)_2$ and about 1.47 grams of $Cu(C_2H_5CO_2)_2$ in about 4.85 ml. of methanol ($CH_3OH$) and about 0.15 ml of propionic acid ($C_2H_6CO_2$). The final volume of the solution was adjusted to about 5 ml with methanol.

The precursor was coated, decomposed, processed and Ag coated as described in example 1. The coating is conducted with the theoretical Y123 thickness equals to 0.8 μm. The resulting film had a smooth and shiny surface. The final thickness after conversion is 1.1 μm. The x-ray diffraction pattern of the final film showed the presence of (001) textured $Y(Dy)Ba_2Cu_3O_{7-x}$ and Ic value at 77K and self-field is above 360 A/cm-w.

EXAMPLE 8

Preparation of Double Coated Superconducting Layers with a Cu Interlayer

A baseline YBCO precursor solution having a stoichiometry of Y:Ba:Cu of 1:2:3.23 was prepared by dissolving about 0.85 grams $Y(CF_3CO_2)_3$, about 1.45 grams of $Ba(CF_3CO_2)_2$ and about 1.35 grams of $Cu(C_2H_5CO_2)_2$ in about 4.85 mL of methanol ($CH_3OH$) and about 0.15 mL of propionic acid ($C_2H_6CO_2$). The final volume of the solution was adjusted to about 5 mL with methanol.

1.2M Cu(C$_2$H$_5$CO$_2$)$_2$ solution was made by dissolving 1.24 g of Cu(C$_2$H$_5$CO$_2$)$_2$ powder in 4.85 ml of methanol and 0.15 ml of C$_2$H$_5$CO$_2$H.

The baseline precursor solution was first deposited on a biaxially textured oxide buffered metallic substrate with the structure Ni(5 at %)W/Y$_2$O$_3$/YSZ/CeO$_2$ by slot die coating technique. The solution was coated on the buffered substrate with the amount targeted to form a 0.8 μm thick REBa$_2$Cu$_3$O$_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 torr (water vapor pressure of about 24 torr and balance oxygen).

The metal oxyfluoride film was then coated with Cu(C$_2$H$_5$CO$_2$)$_2$ solution with targeted thickness of 0.1 μm. The coated film was dried at 95° C. through a heated tunnel. The dried film was then coated again with baseline solution prepared as mentioned earlier with target final thickness of 0.6 μm baseline.

Coated tape was decomposed again to form the intermediate metal oxyfluoride by the same process as mentioned earlier except this time the H$_2$O vapor pressure was controlled to about 6.5 torr.

The decomposed tape was heat treated to form an oxide superconductor. The tape was joined with 4 m of similarly coated NiW leader tape both in front and in the back to establish the uniform and control environment during the reaction. The tape was then reacted at 785° C. with the following parameters. The tape was ramped up to 785° C. with average ramp rate of about 520° C./min. During reaction, the total pressure during reaction was controlled to about 1 torr. The H$_2$O partial pressure was about 800 mtorr and oxygen partial pressure was about 200 mtorr. The reaction time was about 11 min. During cooling, a total pressure of about 1 torr was used with oxygen partial pressure at about 200 mtorr and N$_2$ partial pressure at about 800 mtorr.

The reacted film was coated with 3 μm of Ag protection layer and then annealed in 760 torr oxygen environment. The resulting film carried I$_c$ of about 350 A/cm-width or a Jc of about 2.5 MA/cm$^2$ at 77K, self field.

EXAMPLE 9

Preparation of Double Coated Superconducting Layers with Different Compositions and with Cu Interlayer A baseline YBCO precursor solution having a stoichiometry of Y:Ba:Cu of 1:2:3.23 was prepared by dissolving about 0.85 grams Y(CF$_3$CO$_2$)$_3$, about 1.45 grams of Ba(CF$_3$CO$_2$)$_2$ and about 1.35 grams of Cu(C$_2$H$_5$CO$_2$)$_2$ in about 4.85 mL of methanol (CH$_3$OH) and about 0.15 mL of propionic acid (C$_2$H$_6$CO$_2$). The final volume of the solution was adjusted to about 5 mL with methanol.

A baseline YBCO precursor solution with 50% dysprosium addition having a stoichiometry of Y:Dy:Ba:Cu of 1:0.5:2:3.23 was prepared by dissolving about 1.70 grams Dy(CH$_3$CO$_2$)$_3$, and about 1.90 mL of methanol (CH$_3$OH) in about 20 mL of baseline solution. The final volume of the solution was adjusted to about 25 mL with baseline solution.

1.2M Cu(C$_2$H$_5$CO$_2$)$_2$ solution was made by dissolving 1.24 g of Cu(C$_2$H$_5$CO$_2$)$_2$ powder in 4.85 ml of methanol and 0.15 ml of C$_2$H$_5$CO$_2$H.

The 50% Dy added precursor solution was deposited on a biaxially textured oxide buffered metallic substrate with the structure Ni(5 at %)W/Y$_2$O$_3$/YSZ/CeO$_2$ by slot die coating technique. The solution was coated on the buffered substrate with the amount targeted to form a 0.8 μm thick REBa$_2$Cu$_3$O$_{7-x}$ film.

The coated sample was decomposed to an intermediate metal oxyfluoride film by heating, in a 2.25" diameter tube furnace, from room temperature to about 200° C. at a rate of about 15° C. per minute, then from about 200° C. to about 250 C at a rate of about 0.9° C. per minute and then from about 250° C. to about 400° C. at a rate of about 5° C. per minute in a flowing gas environment having a total gas pressure of about 760 torr (water vapor pressure of about 24 torr and balance oxygen).

The metal oxyfluoride film was then coated with CU(C$_2$H$_5$CO$_2$)$_2$ solution with targeted thickness of 0.1 μm. The coated film was dried at 95° C. through a heated tunnel. The dried film was then coated again with baseline solution prepared as mentioned earlier with target final thickness of 0.6 μm Y.Ba$_2$Cu$_3$O$_x$.

Coated tape was decomposed again to form the intermediate metal oxyfluoride by the same process as mentioned earlier except this time the H$_2$O vapor pressure was controlled to about 6.5 torr.

The decomposed tape was heat treated to form an oxide superconductor. The tape was joined with 4 m of similarly coated NiW leader tape both in front and in the back to establish the uniform and control environment during the reaction. The tape was then reacted at 785° C. with the following parameters. The tape was ramped up to 785° C. with average ramp rate of about 520° C./min. During reaction, the total pressure during reaction was controlled to about 1 torr. The H$_2$O partial pressure was about 800 mtorr and oxygen partial pressure was about 200 mtorr. The reaction time was about 11 min. During cooling, a total pressure of about 1 torr was used with oxygen partial pressure at about 200 mtorr and N$_2$ partial pressure at about 800 mtorr.

Figure 8:
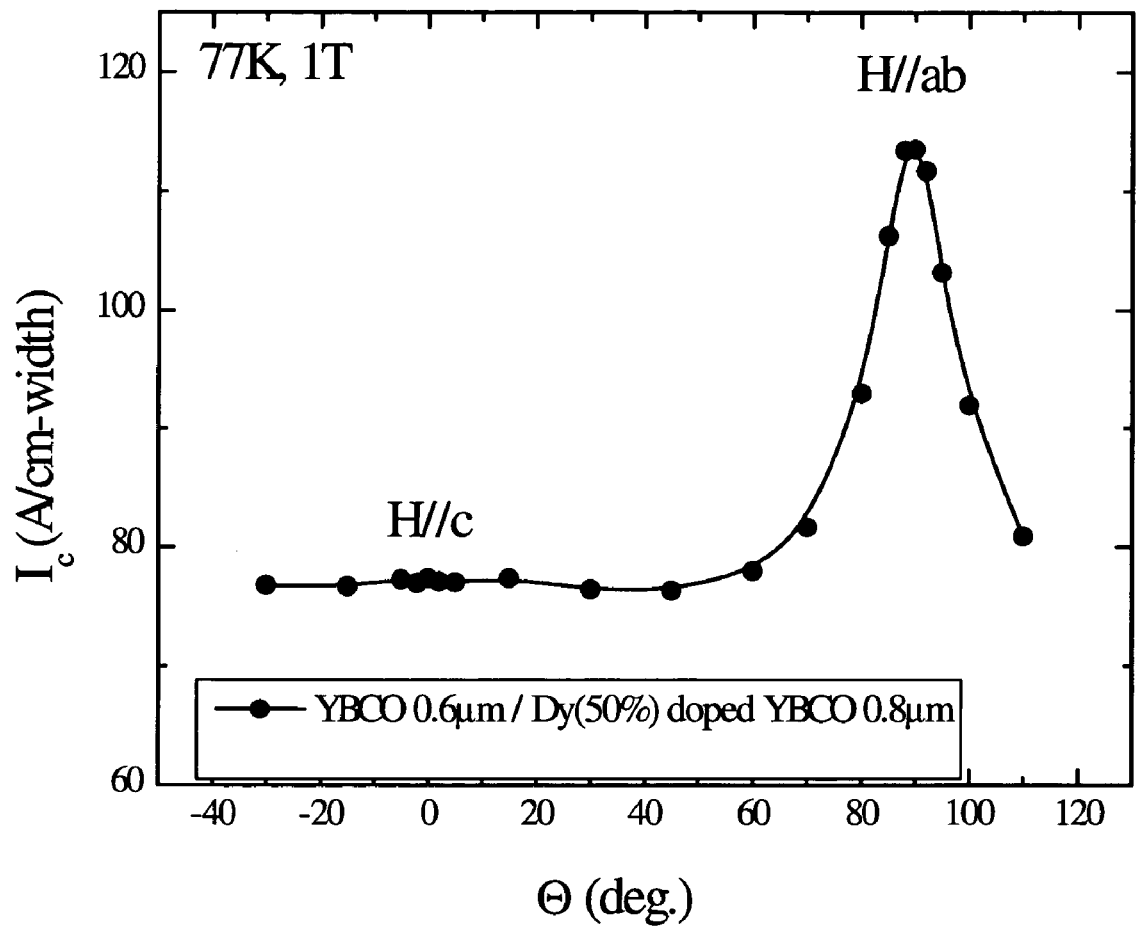
FIG. 8 is a plot of the critical current (Ic) versus magnetic field orientation (Θ) at 77 K and 1 Tesla of the HTS wire described in Example 9.

The reacted film was coated with 3 μm of Ag protection layer and then annealed in 760 torr oxygen environment. The resulting film carried I$_c$ of about 350 A/cm-width or a Jc of about 2.5 MA/cm$^2$ at 77K, self field. The critical current (Ic) versus magnetic field orientation (Θ) at 77K and 1 Tesla is plotted in FIG. 8. At 77 K and 1 Tesla, the HTS wire carries an overall Ic of 78 A/cm-width and 113 A/cm-width with the field parallel and perpendicular to the sample surface, respectively.

INCORPORATION BY REFERENCE

The following documents are hereby incorporated by reference: U.S. Pat. No. 5,231,074, issued on Jul. 27, 1993, and entitled "Preparation of Highly Textured Oxide Superconducting Films from MOD Precursor Solutions," U.S. Pat. No. 6,022,832, issued Feb. 8, 2000, and entitled "Low Vacuum Process for Producing Superconductor Articles with Epitaxial Layers," U.S. Pat. No. 6,027,564, issued Feb. 22, 2000, and entitled "Low Vacuum Process for Producing Epitaxial Layers," U.S. Pat. No. 6,190,752, issued Feb. 20, 2001, and entitled "Thin Films Having Rock-Salt-Like Structure Deposited on Amorphous Surfaces," PCT Publication No. WO 00/58530, published on Oct. 5, 2000, and entitled "Alloy Materials," PCT Publication No. WO/58044, published on Oct. 5, 2000, and entitled "Alloy Materials," PCT Publication No. WO 99/17307, published on Apr. 8, 1999, and entitled "Substrates with Improved Oxidation Resistance," PCT Publication No. WO 99/16941, published on Apr. 8, 1999, and entitled "Substrates for Superconductors," PCT Publication No. WO 98/58415, published on Dec. 23, 1998, and entitled "Controlled Conversion of Metal Oxyfluorides into Superconducting Oxides," PCT Publication No. WO 01/11428, published on Feb. 15, 2001, and entitled "Multi-Layer Articles and Methods of Making Same," PCT Publication No. WO 01/08232, published on Feb. 1, 2001, and entitled "Multi-Layer Articles And Methods Of Making Same," PCT Publication No. WO 01/08235, published on Feb. 1, 2001, and entitled "Methods And Compositions For Making A Multi-Layer Article," PCT Publication No. WO 01/08236, published on Feb. 1, 2001, and entitled "Coated Conductor Thick Film Precursor", PCT Publication No. WO 01/08169, published on Feb. 1, 2001, and entitled "Coated Conductors With Reduced A.C. Loss" PCT Publication No. WO 01/15245, published on Mar. 1, 2001, and entitled "Surface Control Alloy Substrates And Methods Of Manufacture Therefore," PCT Publication No. WO 01/08170, published on Feb. 1, 2001, and entitled "Enhanced Purity Oxide Layer Formation," PCT Publication No. WO 01/26164, published on Apr. 12, 2001, and entitled "Control of Oxide Layer Reaction Rates," PCT Publication No. WO 01/26165, published on Apr. 12, 2001, and entitled "Oxide Layer Method," PCT Publication No. WO 01/08233, published on Feb. 1, 2001, and entitled "Enhanced High Temperature Coated Superconductors," PCT Publication No. WO 01/08231, published on Feb. 1, 2001, and entitled "Methods of Making A Superconductor," PCT Publication No. WO 02/35615, published on Apr. 20, 2002, and entitled "Precursor Solutions and Methods of Using Same," U.S. Pat. No. 6,436,317, filed on May 26, 2000, and entitled, "Oxide Bronze Compositions And Textured Articles Manufactured In Accordance Therewith;" and U.S. Provisional Patent Application Ser. No. 60/309,116, filed on Jul. 31, 2001, and entitled "Multi-Layer Superconductors And Methods Of Making Same;" U.S. patent application Ser. No. 10/208,134, filed on Jul. 30, 2002, and entitled "Superconductor Methods and Reactor;" and U.S. Provisional Patent Application Ser. No. 60/308,957, filed on Jul. 31, 2001, and entitled "Superconductor Methods and Reactors;" and U.S. Provisional Patent Application Ser. No. 60/166,297, filed on Nov. 18, 1999, and entitled "Superconductor Articles and Compositions and Methods for Making Same," and commonly owned U.S. patent application Ser. No. 09/615,999, filed on Jul. 14, 2000, and entitled "Superconductor Articles and Compositions and Methods for Making Same," both of which are hereby incorporated by reference.

What is claimed is:

1. An article comprising:
a biaxially textured substrate having thereon a superconducting layer, wherein said superconducting layer comprises a rare earth alkaline earth copper oxide 123 superconductor, and wherein said substrate comprises a buffer layer;
said superconducting layer having a thickness of greater than 0.8 μm;
said superconductor layer having a Cu to alkaline earth metal ratio of about 1.5 at the buffer layer and the superconductor layer interface;
said superconducting layer having an overall Cu to alkaline earth metal ratio of greater than 1.5;
said superconducting layer comprising fluoride; and
said superconducting layer having at least about 20 mol % excess copper.

2. The article of claim 1, wherein said substrate comprises a buffer layer comprising a material selected from the group consisting of cerium oxide, lanthanum aluminum oxide, lanthanum manganese oxide, strontium titanium oxide, magnesium oxide, neodymium gadolinium oxide, and a cerium oxide/yttria-stabilized zirconia.

3. The article of claim 1, wherein the copper to alkaline earth metal ratio is greater than about 1.6.

4. The article of claim 1, wherein the oxide 123 superconductor has a thickness greater than about 1.0 μm.

5. The article of claim 1, wherein said superconducting layer has a critical current density of at least 200 Amps/cmW at a temperature of 77 K.

6. A metal 123 oxyfluoride film comprising:
123 oxyfluoride film on a substrate, the film comprising one or more rare earth elements, one or more alkaline earth metals and one or more transition metals,
and wherein said superconducting film has at least about 20 mol % excess transition metal, and the ratio of the transition metal to the alkaline earth metal is greater than 1.5 and the film has a ratio of transition metal to alkaline earth metal of about 3:2 proximate to the substrate/metal oxyfluoride interface.

7. The metal 123 oxyfluoride film of claim 6, wherein said substrate comprises a buffer layer comprising a material selected from the group consisting of cerium oxide, lanthanum aluminum oxide, lanthanum manganese oxide, strontium titanium oxide, magnesium oxide, neodymium gadolinium oxide, and a cerium oxide/yttria-stabilized zirconia.

8. The metal 123 oxyfluoride film of claim 7, wherein the copper to alkaline earth ratio is greater than 1.6.

9. The metal 123 oxyfluoride film of claim 7, wherein the thickness of the film is greater than 1.0 μm.

10. An oxide 123 superconductor prepared by a process comprising the steps of:
adjusting the ratio of a transition metal to an alkaline earth metal in a precursor solution, wherein the ratio of the transition metal to the alkaline earth metal is greater than 1.5, wherein the transition metal and the alkaline earth metal in the precursor solution is a salt of the transition metal and a salt of the alkaline earth metal in one or more solvents, wherein at least one of the salts is a fluoride-containing salt;
depositing a single layer of the precursor solution onto a substrate to form a precursor film; and
decomposing the precursor film to achieve a ratio of the transition metal to the alkaline earth metal of about 1.5 proximate to the precursor film and substrate interface,
wherein the overall ratio of the transition metal to the alkaline earth metal in the oxide 123 superconductor is greater than 1.5, and wherein the overall thickness of the oxide 123 superconductor is greater than 0.8 μm.

11. The oxide 123 superconductor prepared by the process of claim 10, wherein adjusting the ratio of the transition metal to the alkaline earth metal comprises increasing the transition metal content in the precursor solution.

12. The oxide 123 superconductor prepared by the process of claim 10, wherein the transition metal content in the precursor solution is increased by at least mol 5%.

13. The oxide 123 superconductor prepared by the process of claim 10, wherein the transition metal content in the precursor solution is increased by at least mol 20%.

14. The oxide 123 superconductor prepared by the process of claim 10 wherein adjusting the ratio of the transition metal to the alkaline earth metal comprises decreasing the alkaline earth metal content in the precursor solution.

15. The oxide 123 superconductor prepared by the process of claim 14, wherein the alkaline earth metal content in the precursor solution is decreased by at least mol 5%.

16. The oxide 123 superconductor prepared by the process of claim 14, wherein the alkaline earth metal content in the precursor solution is decreased by at least mol 20%.

* * * * *

UNITED STATES PATENT AND TRADEMARK OFFICE
CERTIFICATE OF CORRECTION

PATENT NO. : 7,622,424 B2
APPLICATION NO. : 11/241636
DATED : November 24, 2009
INVENTOR(S) : Li et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 937 days.

Signed and Sealed this

Twenty-sixth Day of October, 2010

David J. Kappos
*Director of the United States Patent and Trademark Office*